(12) United States Patent
Fukuzawa

(10) Patent No.: US 7,845,227 B2
(45) Date of Patent: *Dec. 7, 2010

(54) DETECTION DEVICE, SENSOR, AND ELECTRONIC INSTRUMENT

(75) Inventor: Akihiro Fukuzawa, Hino (JP)

(73) Assignee: Seiko Epson Corporation, Tokyo (JP)

( * ) Notice: Subject to any disclaimer, the term of this patent is extended or adjusted under 35 U.S.C. 154(b) by 457 days.

This patent is subject to a terminal disclaimer.

(21) Appl. No.: 11/979,814

(22) Filed: Nov. 8, 2007

(65) Prior Publication Data

US 2008/0111625 A1  May 15, 2008

(30) Foreign Application Priority Data

Nov. 10, 2006  (JP)  ............................. 2006-305315

(51) Int. Cl.
*G01P 9/04* (2006.01)
*G01C 19/56* (2006.01)

(52) U.S. Cl. ................................. 73/504.12; 73/504.16

(58) Field of Classification Search .............. 73/504.04, 73/504.12, 504.15, 504.16, 504.14

See application file for complete search history.

(56) References Cited

U.S. PATENT DOCUMENTS

| 5,541,548 | A | | 7/1996 | Crafts | |
| 6,134,961 | A | * | 10/2000 | Touge et al. | 73/504.12 |
| 7,069,783 | B2 | * | 7/2006 | Uehara | 73/514.12 |
| 7,434,466 | B2 | * | 10/2008 | Ito | 73/514.32 |
| 2007/0261488 | A1 | * | 11/2007 | Murashima | 73/504.04 |
| 2008/0111585 | A1 | * | 5/2008 | Fukuzawa | 327/41 |
| 2008/0111627 | A1 | * | 5/2008 | Fukuzawa | 330/261 |

FOREIGN PATENT DOCUMENTS

| JP | A-03-226620 | 10/1991 |
| JP | A-7-211875 | 8/1995 |
| JP | A-2002-324097 | 11/2002 |
| JP | A-2003-21516 | 1/2003 |
| JP | A-2003-174331 | 6/2003 |
| WO | WO 2006/129712 A1 | 12/2006 |

OTHER PUBLICATIONS

Pending U.S. Patent Application; Fukuzawa, Akihiro; Filed Nov. 8, 2007.
U.S. Appl. No. 11/803,167, filed May 11, 2007.

* cited by examiner

*Primary Examiner*—Helen C. Kwok
(74) *Attorney, Agent, or Firm*—Oliff & Berridge, PLC

(57) ABSTRACT

A detection device includes a detection circuit. The detection circuit includes an amplifier circuit, a synchronous detection circuit, and a filter section. The amplifier circuit includes a first-type operational amplifier, and the filter section includes a second-type operational amplifier. When a channel width and a channel length of a differential-stage transistor of a differential section of the first-type operational amplifier are respectively referred to as W1$a$ and L1$a$, a bias current flowing through the differential section is referred to as Ia, a channel width and a channel length of a differential-stage transistor of a differential section of the second-type operational amplifier are respectively referred to as W1$b$ and L1$b$, and a bias current flowing through the differential section is referred to as Ib, W1$b$×L1$b$>W1$a$×L1$a$ and Ia>Ib are satisfied.

20 Claims, 21 Drawing Sheets

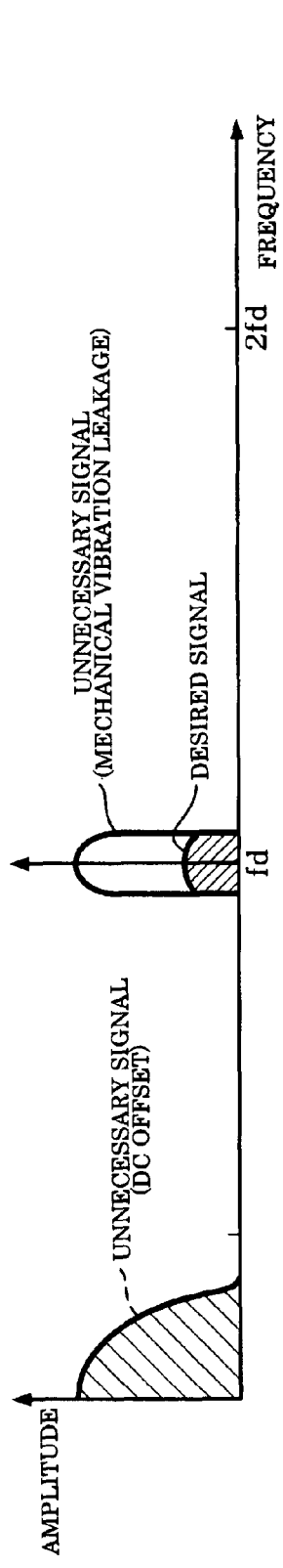
FIG. 3A BEFORE SYNCHRONOUS DETECTION
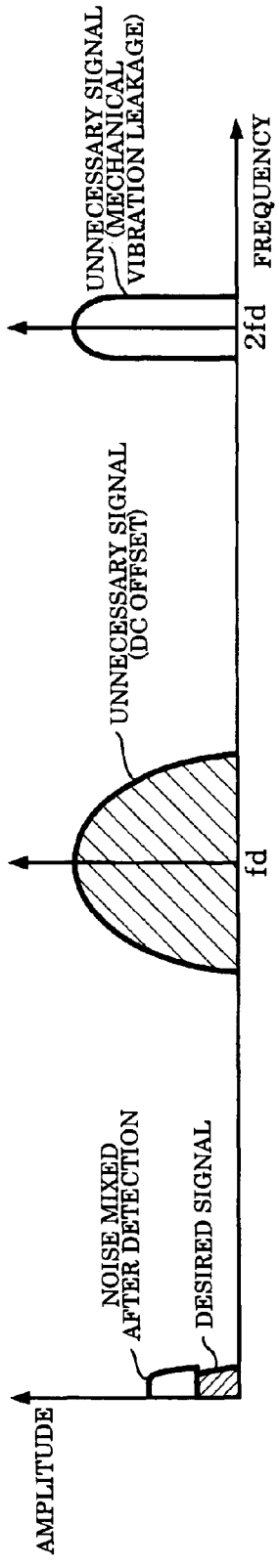
FIG. 3B AFTER SYNCHRONOUS DETECTION
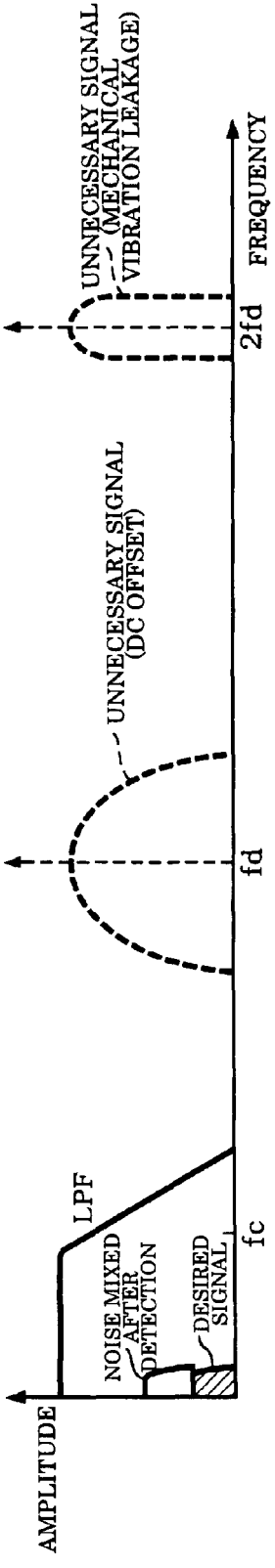
FIG. 3C AFTER FILTERING PROCESS

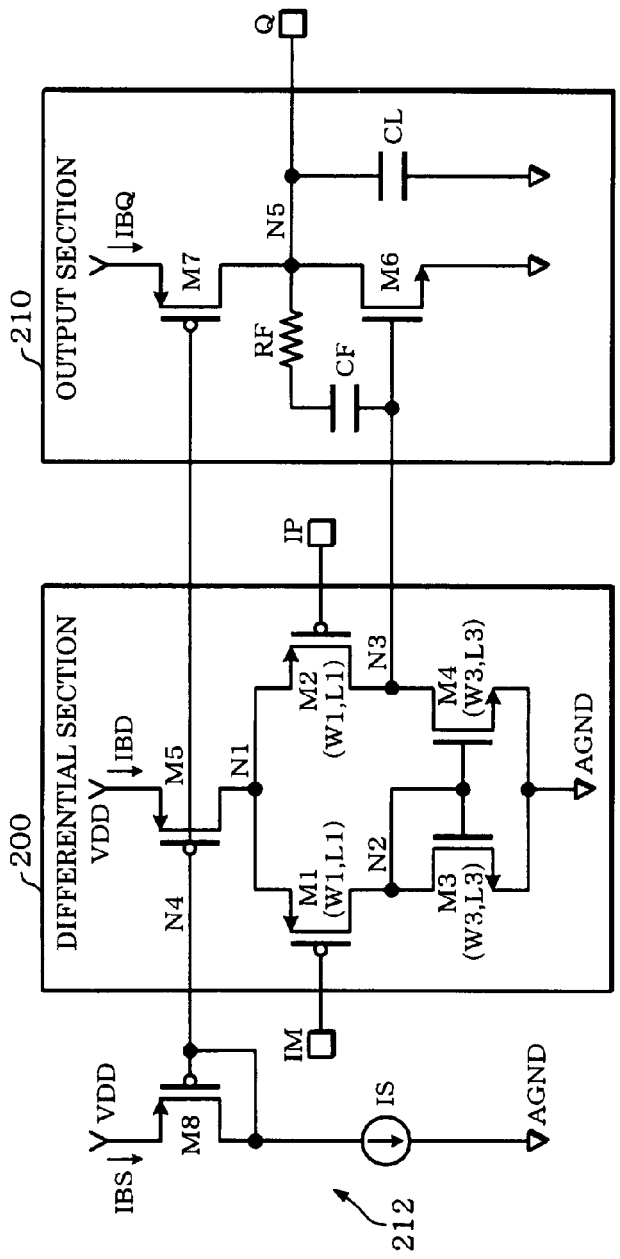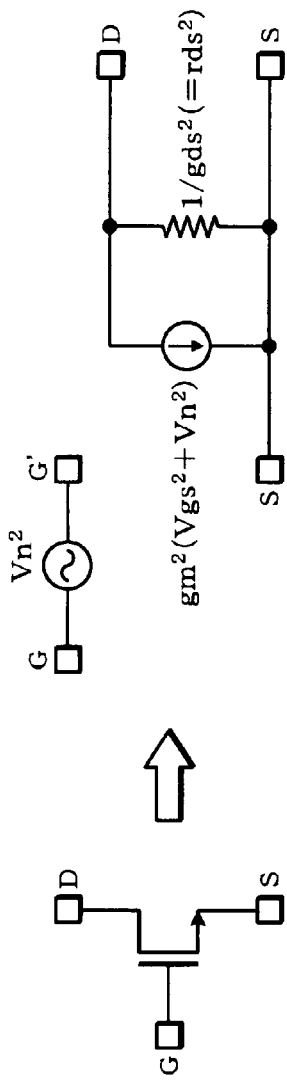
FIG. 4A
FIG. 4B

FIG. 5A

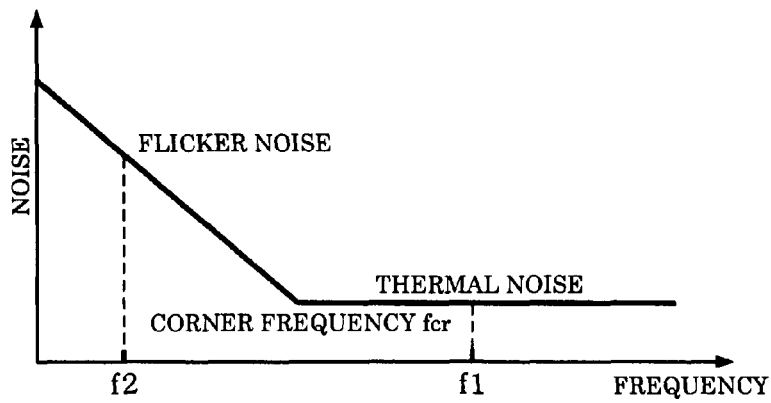

FIG. 5B

| FIRST-TYPE OPERATIONAL AMPLIFIER OP1 | SECOND-TYPE OPERATIONAL AMPLIFIER OP2 | THIRD-TYPE OPERATIONAL AMPLIFIER OP3 |
|---|---|---|
| $W1 \times L1 = W1a \times L1a$<br>$IBD = Ia$<br>$fop = f1$<br><br>$RT1 = RT1a = W1a/L1a$<br>$RT3 = RT3a = W3a/L3a$ | $W1 \times L1 = W1b \times L1b$<br>$IBD = Ib$<br>$fop = f2$<br><br>$L1/L3 = L1b/L3b$ | $W1 \times L1 = W1c \times L1c$<br>$IBD = Ic$ |

FIG. 5C

|  | OP1 (THERMAL NOISE REDUCTION) | OP2 (FLICKER NOISE REDUCTION) | OP3 |
|---|---|---|---|
| $W1 \times L1$ | SMALL ($W1a \times L1a$) | LARGE ($W1b \times L1b$) | LARGE ($W1c \times L1c$) |
| IBD | LARGE (Ia) | SMALL (Ib) | LARGE (Ic) |
| fop | HIGH (f1) | LOW (f2) |  |
| L1/L3 |  | SMALL (L1b<L3b) |  |
| RT1/RT3 | LARGE (RT1a>RT3a) |  |  |

$W1b \times L1b > W1a \times L1a$  　　$W1c \times L1c > W1a \times L1a$
$Ia > Ib$  　　　　　　　　　　　　$Ic > Ib$ FIG. 6A
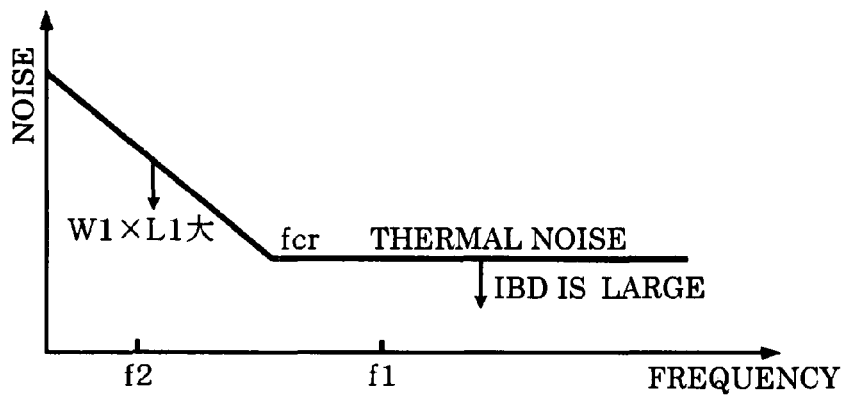
FIG. 6B FIRST-TYPE OPERATIONAL AMPLIFIER OP1
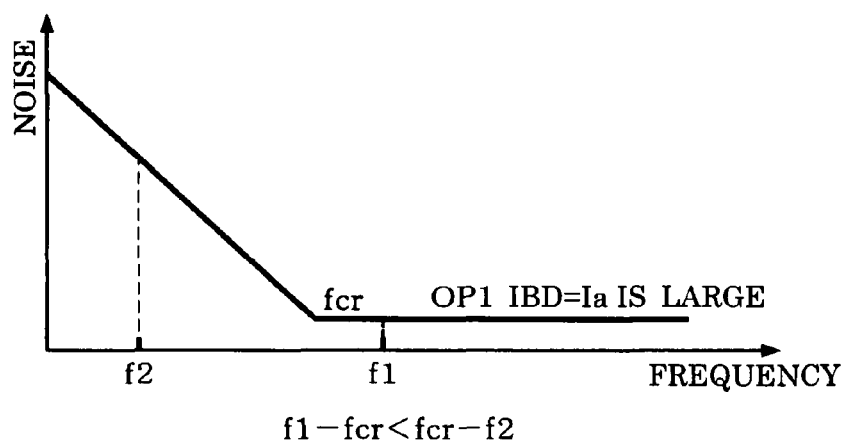
FIG. 6C SECOND-TYPE OPERATIONAL AMPLIFIER OP2
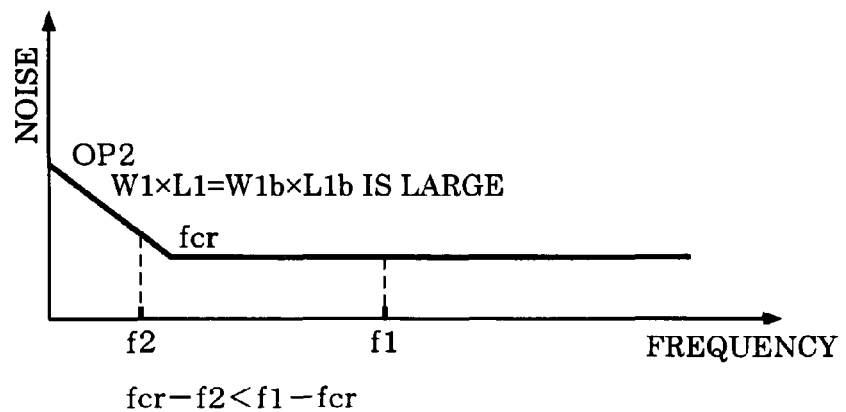

FIG. 7A  FIRST-TYPE OPERATIONAL AMPLIFIER OP1
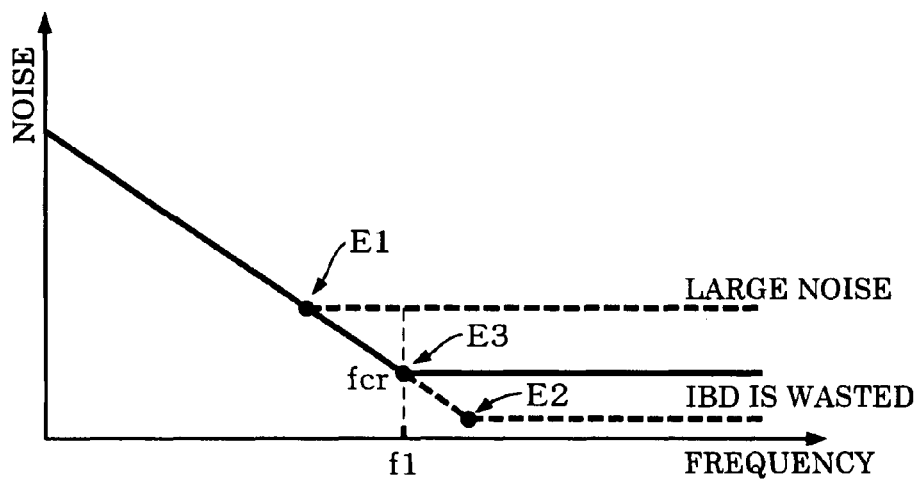
FIG. 7B  SECOND-TYPE OPERATIONAL AMPLIFIER OP2
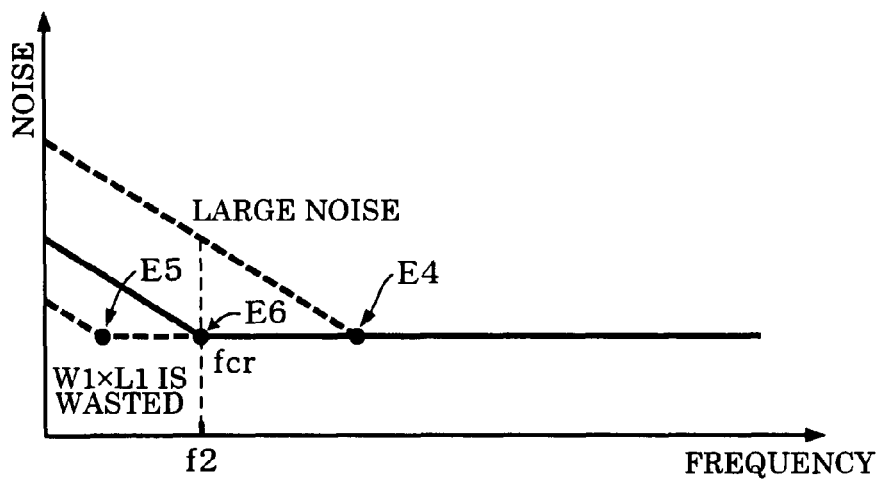

DETECTION DEVICE, SENSOR, AND ELECTRONIC INSTRUMENT

Japanese Patent Application No. 2006-305315 filed on Nov. 10, 2006, is hereby incorporated by reference in its entirety.

BACKGROUND OF THE INVENTION

The present invention relates to a detection device, a sensor, and an electronic instrument.

A gyrosensor for detecting a physical quantity which changes due to external factors is incorporated in electronic instruments such as a digital camera, a video camera, a portable telephone, and a car navigation system. The gyrosensor detects a physical quantity such as an angular velocity, and is used for image blur correction, position control, GPS autonomous navigation, and the like.

In recent years, a piezoelectric vibrating gyrosensor has attracted attention as one type of gyrosensor. In particular, a crystal piezoelectric vibrating gyrosensor using a crystal as the piezoelectric material is expected to be a sensor optimum for incorporation into many devices. A detection device of such a vibrating gyrosensor detects a desired signal which is a signal corresponding to the Coriolis force which occurs due to the rotation of the gyrosensor to determine the angular velocity (e.g., JP-A-3-226620).

In such a vibrating gyrosensor, the level of a gyrosensor detection signal (detection current) from a vibrator has become very weak due to a reduction in weight and size of the vibrator. Therefore, a detection device of a vibrating gyrosensor has been required to exhibit more improved signal-to-noise ratio (SNR) performance. However, it is difficult to satisfy such a demand using a normal operational amplifier. When a vibrating gyrosensor is incorporated in an electronic instrument (e.g., portable telephone) for which a reduction in power consumption is demanded, it is desirable to reduce the power consumption of a detection device of the vibrating gyrosensor.

SUMMARY

According to one aspect of the invention, there is provided a detection device comprising:

a detection circuit that receives a detection signal from a physical quantity transducer driven using a driving signal, and detects a desired signal from the detection signal, the detection circuit including:

an amplifier circuit that amplifies the detection signal from the physical quantity transducer;

a synchronous detection circuit that synchronously detects the signal amplified by the amplifier circuit; and a filter section provided in a subsequent stage of the synchronous detection circuit;

the amplifier circuit including a first-type operational amplifier;

the filter section including a second-type operational amplifier; and when a channel width and a channel length of a differential-stage transistor of a differential section of the first-type operational amplifier are respectively referred to as W1$a$ and L1$a$, a bias current flowing through the differential section of the first-type operational amplifier is referred to as Ia, a channel width and a channel length of a differential-stage transistor of a differential section of the second-type operational amplifier are respectively referred to as W1$b$ and L1$b$, and a bias current flowing through the differential section of the second-type operational amplifier is referred to as Ib, W1$b$×L1$b$>W1$a$×L1$a$ and Ia>Ib being satisfied.

According to another aspect of the invention, there is provided a detection device comprising:

a detection circuit that receives a detection signal from a physical quantity transducer driven using a driving signal, and detects a desired signal from the detection signal, the detection circuit including:

an amplifier circuit that amplifies the detection signal from the physical quantity transducer;

a synchronous detection circuit that synchronously detects the signal amplified by the amplifier circuit; and a filter section provided in a subsequent stage of the synchronous detection circuit;

the amplifier circuit including a first-type operational amplifier;

the filter section including a second-type operational amplifier;

the first-type operational amplifier being an operational amplifier of which thermal noise at a frequency of a carrier signal is lower than that of the second-type operational amplifier; and the second-type operational amplifier being an operational amplifier of which flicker noise at a frequency of the desired signal is lower than that of the first-type operational amplifier.

According to a further aspect of the invention, there is provided a sensor comprising:

one of the above detection devices; and the physical quantity transducer.

According to still another aspect of the invention, there is provided an electronic instrument comprising:

the above sensor; and a processing section that performs processes based on detection information of the sensor.

BRIEF DESCRIPTION OF THE SEVERAL VIEWS OF THE DRAWING

FIGS. 3A to 3C are views illustrative of a frequency spectrum.

FIGS. 4A and 4B are views illustrative of a noise analysis of an operational amplifier.

FIGS. 5A to 5C are views illustrative of a noise reduction method according to one embodiment of the invention.

FIGS. 6A to 6C are views illustrative of the relationship among frequencies f1 and f2 and a corner frequency fcr.

FIGS. 7A and 7B are views illustrative of a method of setting a corner frequency fcr in first-type and second-type operational amplifiers.

DETAILED DESCRIPTION OF THE EMBODIMENT

Figure 1:
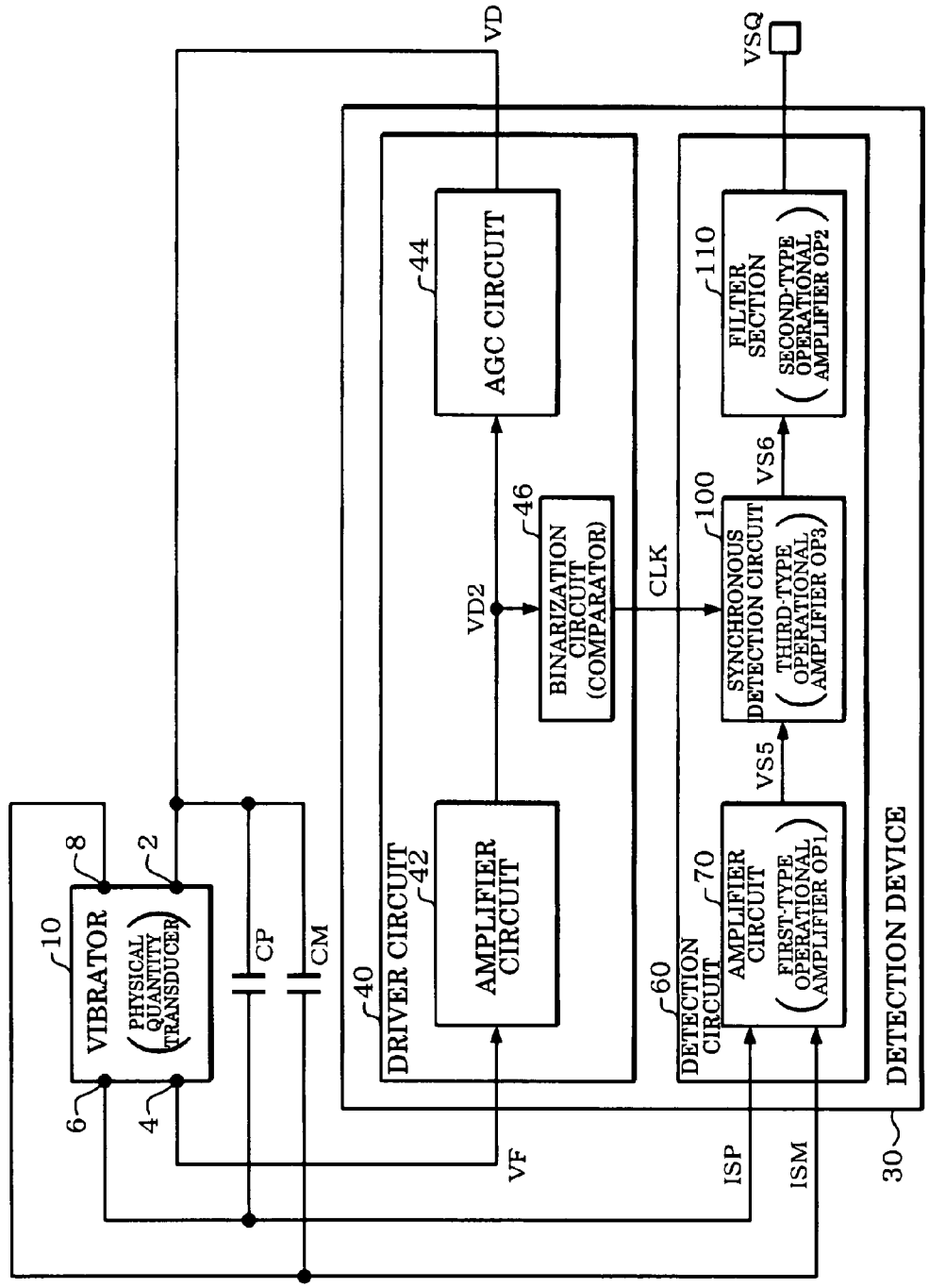
FIG. 1 shows a configuration example of a detection device according to one embodiment of the invention.

Aspects of the invention may provide a detection device, a sensor, and an electronic instrument capable of reducing noise and power consumption.

According to one embodiment of the invention, there is provided a detection device comprising:

a detection circuit that receives a detection signal from a physical quantity transducer driven using a driving signal, and detects a desired signal from the detection signal, the detection circuit including:

an amplifier circuit that amplifies the detection signal from the physical quantity transducer;

a synchronous detection circuit that synchronously detects the signal amplified by the amplifier circuit; and a filter section provided in a subsequent stage of the synchronous detection circuit;

the amplifier circuit including a first-type operational amplifier;

the filter section including a second-type operational amplifier; and when a channel width and a channel length of a differential-stage transistor of a differential section of the first-type operational amplifier are respectively referred to as W1$a$ and L1$a$, a bias current flowing through the differential section of the first-type operational amplifier is referred to as Ia, a channel width and a channel length of a differential-stage transistor of a differential section of the second-type operational amplifier are respectively referred to as W1$b$ and L1$b$, and a bias current flowing through the differential section of the second-type operational amplifier is referred to as Ib, W1$b$×L1$b$>W1$a$×L1$a$ and Ia>Ib being satisfied.

According to this embodiment, the amplifier circuit provided in the preceding stage of the synchronous detection circuit includes the first-type operational amplifier, and the filter section provided in the subsequent stage of the synchronous detection circuit includes the second-type operational amplifier.

The WL product W1$a$×L1$a$ of the differential-stage transistor of the first-type operational amplifier and the WL product W1$b$×L1$b$ of the differential-stage transistor of the second-type operational amplifier satisfy the relationship W1$b$×L1$b$>W1$a$×L1$a$. Therefore, since the WL product W1$b$×L1$b$ of the second-type operational amplifier can be increased, flicker noise of the second-type operational amplifier can be reduced, whereby the SNR of the detection device can be increased. On the other hand, since the WL product W1$a$×L1$a$ of the first-type operational amplifier can be reduced, a situation can be prevented in which the circuit area of the first-type operational amplifier is unnecessarily increased, whereby the scale of the detection device can be reduced.

The bias current Ia of the differential section of the first-type operational amplifier and the bias current Ib of the differential section of the second-type operational amplifier satisfy the relationship Ia>Ib. Therefore, since the bias current Ia of the first-type operational amplifier can be increased, thermal noise of the first-type operational amplifier can be reduced, whereby the SNR of the detection device can be increased. On the other hand, since the bias current Ib of the second-type operational amplifier can be reduced, a situation can be prevented in which the current consumption of the second-type operational amplifier is unnecessarily increased, whereby the power consumption of the detection device can be reduced.

In the detection device, when a frequency of a carrier signal is referred to as f1, a frequency of the desired signal carried by the carrier signal is referred to as f2, and a corner frequency of flicker noise and thermal noise in frequency-noise characteristics is referred to as fcr, the first-type operational amplifier may satisfy f1−fcr<fcr−f2, and the second-type operational amplifier may satisfy fcr−f2<f1−fcr.

If the relationship f1−fcr<fcr−f2 is satisfied, the corner frequency fcr can be brought close to the frequency f1, whereby the noise and the power consumption of the operational amplifier can be reduced. If the relationship fcr−f2<f1−fcr is satisfied, the corner frequency fcr can be brought close to the frequency f2, whereby the noise and the area of the operational amplifier can be reduced.

In the detection device, the amplifier circuit may include:

first and second charge/voltage conversion circuits or first and second current/voltage conversion circuits that respectively amplify first and second detection signals from the physical quantity transducer; and a differential amplifier circuit that differentially amplifies first and second output signals from the first and second charge/voltage conversion circuits or the first and second current/voltage conversion circuits; and wherein the first and second charge/voltage conversion circuits or the first and second current/voltage conversion circuits and the differential amplifier circuit may include the first-type operational amplifier.

This reduces the noise of the first and second charge/voltage conversion circuits or the first and second current/voltage conversion circuits and the differential amplifier circuit.

In the detection device, the detection circuit may include a sensitivity adjustment circuit that is provided in a preceding stage of the synchronous detection circuit and adjusts sensitivity by variably controlling a gain; and the sensitivity adjustment circuit may include the first-type operational amplifier.

The noise of the sensitivity adjustment circuit can be reduced by forming the sensitivity adjustment circuit using the first-type operational amplifier. Moreover, since the sensitivity adjustment is performed for a signal having a frequency other than a DC frequency by providing the sensitivity adjustment circuit in the preceding stage of the synchronous detection circuit, noise can be further reduced. Furthermore, since the number of circuit blocks in the preceding stage of the sensitivity adjustment circuit is reduced, deterioration in SNR, which occurs when the sensitivity adjustment circuit amplifies the noise generated by these circuit blocks, can be minimized.

In the detection device, the sensitivity adjustment circuit may operate as a programmable-gain amplifier and a high-pass filter.

According to this configuration, a DC component can be cut off using the high-pass filter, whereby a situation can be prevented in which a DC signal is amplified by the sensitivity adjustment circuit. This prevents a problem in which a programmable-gain amplifier of the sensitivity adjustment circuit or the operational amplifier in the subsequent stage is saturated. Moreover, since the number of circuit blocks can be reduced, the SNR can be increased.

In the detection device, the first-type operational amplifier may be used in common by the high-pass filter as an active filter and the programmable-gain amplifier.

According to this configuration, since the number of operational amplifiers as the noise source can be reduced, the SNR can be increased while reducing the circuit scale.

In the detection device,
the filter section may include:
a discrete-time filter; and
a continuous-time filter provided in a preceding stage of the discrete-time filter; and
wherein the discrete-time filter may include the second-type operational amplifier.

The noise of the discrete-time filter can be reduced by forming the discrete-time filter using the second-type operational amplifier.

In the detection device,
the physical quantity transducer may be a vibrator that is caused to produce vibrations using a driving signal; and
the discrete-time filter may have frequency characteristics for removing a component having a detuning frequency $\Delta f=|fd-fs|$ corresponding to a difference between a driving-side resonance frequency fd and a detection-side resonance frequency fs of the vibrator and allowing a frequency component of the desired signal to pass through.

According to this configuration, even if the detuning frequency $\Delta f$ is sufficiently lower than the frequency fd, the component of the unnecessary signal having the detuning frequency $\Delta f$ can be reliably and easily removed.

In the detection device,
the continuous-time filter may include the second-type operational amplifier; and
the continuous-time filter may have frequency characteristics for attenuating amplitude of an unnecessary signal which appears in a frequency band of a frequency k×fd (k is a positive integer) due to synchronous detection by the synchronous detection circuit to a value equal to or smaller than amplitude of the desired signal.

According to this configuration, the unnecessary signal which appears in the frequency band of the frequency k×fd due to fold-over of the discrete-time filter can be attenuated to an amplitude equal to or less than the amplitude of the desired signal using the continuous-time filter while removing the unnecessary signal having the detuning frequency $\Delta f$ using the discrete-time filter. Therefore, the unnecessary signal can be efficiently removed.

In the detection device,
the synchronous detection circuit may include a third-type operational amplifier; and
when a channel width and a channel length of a differential-stage transistor of a differential section of the third-type operational amplifier are respectively referred to as $W1c$ and $L1c$ and a bias current which flows through the differential section of the third-type operational amplifier is referred to as Ic, $W1c \times L1c > W1a \times L1a$ and Ic>Ib may be satisfied.

If the relationship $W1c \times L1c > W1a \times L1a$ is satisfied, the WL product $W1c \times L1c$ of the third-type operational amplifier can be increased, whereby the flicker noise of the third-type operational amplifier can be reduced. If the relationship Ic>Ib is satisfied, the bias current Ic of the third-type operational amplifier can be increased, whereby the thermal noise of the third-type operational amplifier can be reduced. This enables the SNR of the detection device to be increased.

The analog circuit may further comprise:
a reference voltage supply circuit that supplies an analog reference voltage to the detection circuit;
wherein the reference voltage supply circuit may include:
a first supply circuit that includes a reference-voltage first-type operational amplifier and supplies the analog reference voltage to the amplifier circuit; and
a second supply circuit that includes a reference-voltage second-type operational amplifier and supplies the analog reference voltage to the filter section; and
wherein, when a channel width and a channel length of a differential-stage transistor of a differential section of the reference-voltage first-type operational amplifier are respectively referred to as $W1d$ and $L1d$, a bias current flowing through the differential section of the reference-voltage first-type operational amplifier is referred to as Id, a channel width and a channel length of a differential-stage transistor of a differential section of the reference-voltage second-type operational amplifier are respectively referred to as $W1e$ and $L1e$, and a bias current flowing through the differential section of the reference-voltage second-type operational amplifier is referred to as Ie, $W1e \times L1e > W1d \times L1d$ and Id>Ie may be satisfied.

If the relationship Id>Ie is satisfied, thermal noise superimposed on the analogue reference voltage supplied from the first supply circuit can be minimized, whereby an increase in thermal noise in the amplifier circuit of the detection device can be prevented. If the relationship $W1e \times L1e > W1d \times L1d$ is satisfied, flicker noise superimposed on the analogue reference voltage supplied from the second supply circuit can be minimized, whereby an increase in flicker noise in the filter section of the detection device can be prevented.

According to another embodiment of the invention, there is provided a detection device comprising:
a detection circuit that receives a detection signal from a physical quantity transducer driven using a driving signal, and detects a desired signal from the detection signal, the detection circuit including:
an amplifier circuit that amplifies the detection signal from the physical quantity transducer;
a synchronous detection circuit that synchronously detects the signal amplified by the amplifier circuit; and
a filter section provided in a subsequent stage of the synchronous detection circuit;
the amplifier circuit including a first-type operational amplifier;
the filter section including a second-type operational amplifier;
the first-type operational amplifier being an operational amplifier of which thermal noise at a frequency of a carrier signal is lower than that of the second-type operational amplifier; and
the second-type operational amplifier being an operational amplifier of which flicker noise at a frequency of the desired signal is lower than that of the first-type operational amplifier.

According to this embodiment, the amplifier circuit provided in the preceding stage of the synchronous detection circuit includes the first-type operational amplifier, and the filter section provided in the subsequent stage of the synchronous detection circuit includes the second-type operational amplifier. The first-type operational amplifier is an operational amplifier of which the thermal noise at the frequency of the carrier signal is low, and the second-type operational amplifier is an operational amplifier of which the flicker noise at the frequency of the desired signal is low. Therefore, the first-type operational amplifier and the second-type operational amplifier can be selectively and optimally used depending on the frequency of the target signal, whereby a reduction in noise, power consumption, and circuit scale can be achieved in combination.

In the detection device, when a frequency of a carrier signal is referred to as f1, a frequency of the desired signal carried by the carrier signal is referred to as f2, and a corner frequency of flicker noise and thermal noise in frequency-noise characteristics is referred to as fcr, the first-type operational amplifier may satisfy f1−fcr<fcr−f2, and the second-type operational amplifier may satisfy fcr−f2<f1−fcr.

In the detection device, the synchronous detection circuit may include a third-type operational amplifier; and the third-type operational amplifier may be an operational amplifier of which thermal noise at the frequency of the carrier signal is lower than that of the second-type operational amplifier and flicker noise at the frequency of the desired signal is lower than that of the first-type operational amplifier.

Since flicker noise and thermal noise can be reduced using the third-type operational amplifier for the synchronous detection circuit, the SNR of the detection device can be increased.

In the detection device, the physical quantity transducer may be a vibrator that is caused to produce vibrations using a driving signal.

According to a further embodiment of the invention, there is provided a sensor comprising:

one of the above detection devices; and the physical quantity transducer.

According to still another embodiment of the invention, there is provided an electronic instrument comprising:

the above sensor; and a processing section that performs processes based on detection information of the sensor.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention. For example, the following description is given taking an example in which a physical quantity transducer is a piezoelectric vibrator (vibrating gyroscope) and a sensor is a gyrosensor. Note that the invention is not limited thereto.

1. Configuration of Detection Device

FIG. 1 shows a configuration example of a detection device 30 according to this embodiment. The detection device 30 includes a driver circuit 40 and a detection circuit 60. The detection device 30 is not limited to the configuration shown in FIG. 1. Various modification may be made such as omitting some elements or adding another element. For example, the configuration of the driver circuit 40 may be omitted when a synchronization signal can be extracted based on a detection signal from a vibrator 10.

Figure 2A:
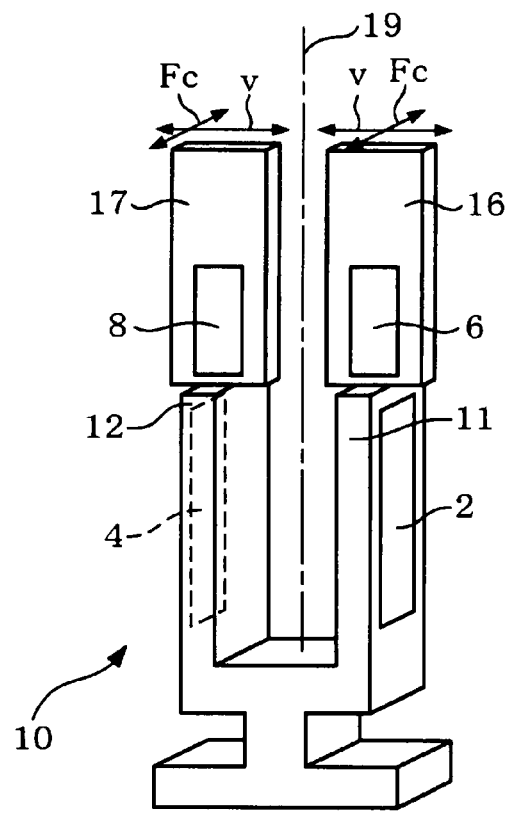
FIGS. 2A and 2B are views illustrative of a vibrator.

The vibrator 10 (vibrating gyroscope) as a physical quantity transducer is a piezoelectric vibrator formed of a piezoelectric material such as a crystal. FIG. 2A shows a tuning-fork piezoelectric vibrator as an example of the vibrator 10. The vibrator 10 includes driving vibrators 11 and 12 and detection vibrators 16 and 17. The driving vibrators 11 and 12 are respectively provided with driving terminals 2 and 4, and the detection vibrators 16 and 17 are respectively provided with detection terminals 6 and 8. FIG. 2A shows an example in which the vibrator 10 is a tuning-fork vibrator. Note that the vibrator 10 according to this embodiment is not limited to the structure shown in FIG. 2A. For example, the vibrator 10 may be a T-shaped vibrator, double-T-shaped vibrator, or the like. The piezoelectric material for the vibrator 10 may be a material other than a crystal. The vibrator 10 (physical quantity transducer) may be an electrostatic micro electro mechanical system (MEMS) which performs a driving/detection operation utilizing capacitance. The physical quantity transducer is an element for converting a physical quantity (indicating the degree of property of an object and expressed in defined units) into another physical quantity. As the conversion target physical quantity, a force such as Coriolis force and gravity, acceleration, mass, and the like can be given. A physical quantity obtained by conversion may be a voltage or the like in addition to current (charge).

The driver circuit 40 outputs a driving signal (driving voltage) VD to drive the vibrator 10 (physical quantity transducer in a broad sense), and receives a feedback signal VF from the vibrator 10. The driver circuit 40 thus causes the vibrator 10 to vibrate. The detection circuit 60 receives detection signals (detection current or charge) ISP and ISM from the vibrator 10 driven by the driving signal VD, and detects (extracts) a desired signal (Coriolis force signal) from the detection signals.

Specifically, the alternating-current driving signal (driving voltage) VD from the driver circuit 40 is applied to the driving terminal 2 of the driving vibrator 11 shown in FIG. 2A. This causes the driving vibrator 11 to start to vibrate due to the reverse voltage effect, and the driving vibrator 12 also starts to vibrate due to the tuning-fork vibration. A current (charge) generated by the piezoelectric effect of the driving vibrator 12 is fed back to the driver circuit 40 from the driving terminal 4 as the feedback signal VF. An oscillation loop including the vibrator 10 is thus formed.

When the driving vibrators 11 and 12 vibrate, the detection vibrators 16 and 17 vibrate in the directions shown in FIG. 2A at a vibration velocity v. A current (charge) generated by the piezoelectric effect of the detection vibrators 16 and 17 is output from the detection terminals 6 and 8 as the detection signals ISP and ISM. The detection circuit 60 receives the detection signals ISP and ISM, and detects the desired signal (desired wave) which is the signal corresponding to the Coriolis force.

Figure 2B:
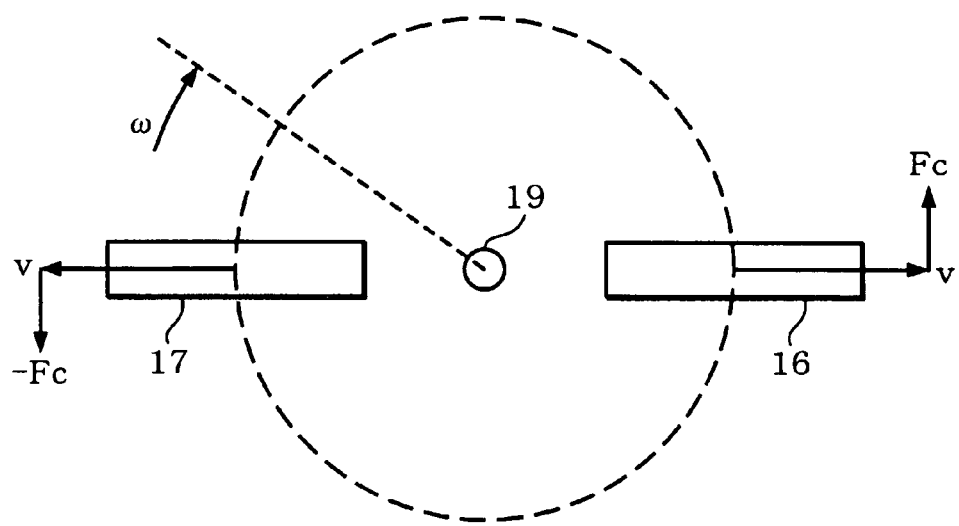

Specifically, when the vibrator 10 (gyrosensor) rotates around a detection axis 19 shown in FIG. 2A, a Coriolis force Fc occurs in the directions perpendicular to the vibration directions at the vibration velocity v. FIG. 2B schematically shows the detection axis 19 shown in FIG. 2A viewed from the upper side. In FIG. 2B, when the angular velocity of the vibrator while the vibrator rotates around the detection axis 19 is referred to as ω, the mass of the vibrator is referred to as m, and the vibration velocity of the vibrator is referred to as v, the Coriolis force is expressed as Fc=2m·v·ω. Therefore, the rotation angular velocity ω of the gyrosensor (vibrator) can be determined by causing the detection circuit 60 to detect (extract) the desired signal which is the signal corresponding to the Coriolis force.

The vibrator 10 has a driving-side resonance frequency fd and a detection-side resonance frequency fs. Specifically, the natural resonance frequency (natural resonance frequency in driving vibration mode) of the driving vibrators 11 and 12 is the frequency fd, and the natural resonance frequency (natural resonance frequency in detection vibration mode) of the detection vibrators 16 and 17 is the frequency fs. In this case, a constant frequency difference is provided between the frequencies fd and fs in a range so that the driving vibrators 11 and 12 and the detection vibrators 16 and 17 can perform the detection operation and have an appropriate intermode coupling which does not cause unnecessary resonant coupling. A detuning frequency $\Delta f=|fd-fs|$ which is the above difference in frequency is set at a value sufficiently lower than the frequencies fd and fs.

The driver circuit (oscillation circuit) 40 includes an amplifier circuit 42, an automatic gain control (AGC) circuit 44 which performs automatic gain control, and a binarization circuit (comparator) 46. The driver circuit 40 must maintain a constant amplitude of the driving voltage supplied to the vibrator 10 (driving vibrator) in order to maintain constant sensitivity of the gyrosensor. Therefore, the AGC circuit 44 for automatic gain adjustment is provided in the oscillation loop of the driving vibration system. Specifically, the AGC circuit 44 variably and automatically adjusts the gain so that the amplitude of the feedback signal FD (vibration velocity v of the vibrator) becomes constant. Note that the phase is adjusted so that the phase shift in the oscillation loop becomes zero degrees (0 deg). In order to enable high-speed oscillation startup, the gain in the oscillation loop is set at a value larger than unity during oscillation startup.

The amplifier circuit 42 amplifies the feedback signal FD from the vibrator 10. Specifically, an I/V conversion circuit included in the amplifier circuit 42 converts a current (charge) as the feedback signal FD from the vibrator 10 into voltage, and outputs the voltage as a driving signal VD2.

The AGC circuit 44 monitors the driving-side amplified signal VD2 which is the signal amplified by the driving-side amplifier circuit 42, and controls the gain in the oscillation loop. The AGC circuit 44 may include a gain control amplifier (GCA) for controlling the oscillation amplitude in the oscillation loop, and a gain control circuit which outputs a control voltage for adjusting the gain of the gain control amplifier corresponding to the oscillation amplitude. The gain control circuit may include a rectifier circuit (full-wave rectifier) which converts the alternating-current driving signal VD2 from the amplifier circuit 42 into a direct-current signal, a circuit which outputs the control voltage corresponding to the difference between the voltage of the direct-current signal from the rectifier circuit and a reference voltage, and the like.

The binarization circuit 46 binarizes the driving-side amplified signal VD2 which is a sine wave, and outputs a synchronization signal (reference signal) CLK obtained by binarization to a synchronous detection circuit 100 of the detection circuit 60. The binarization circuit 46 may be realized by a comparator to which the sine-wave (alternating-current) signal VD2 from the amplifier circuit 42 is input and which outputs the rectangular-wave synchronization signal CLK. Note that another circuit may be provided between the amplifier circuit 42 and the binarization circuit 46 or between the binarization circuit 46 and the synchronous detection circuit 100. For example, a high-pass filter, a phase-shift circuit (phase shifter), or the like may be provided.

The detection circuit 60 includes an amplifier circuit 70, the synchronous detection circuit 100, and a filter section 110. Note that some of these elements may be omitted, or another element may be added.

The amplifier circuit 70 amplifies the detection signals ISP and ISM from the vibrator 10. Specifically, Q/V conversion circuits (I/V conversion circuits) included in the amplifier circuit 70 respectively receive the signals ISP and ISM from the vibrator 10, and convert (amplify) the charge (current) generated by the vibrator 10 into voltage.

The synchronous detection circuit (detection circuit or detector) 100 performs synchronous detection based on the synchronization signal CLK (synchronization clock signal or reference signal). A mechanical vibration leakage unnecessary signal can be removed by synchronous detection.

The filter section 110 provided in the subsequent stage of the synchronous detection circuit 100 filters a signal VS6 obtained by synchronous detection. Specifically, the filter section 110 performs a low-pass filtering process of removing high-frequency components.

The detection signal (sensor signal) from the vibrator 10 includes a desired signal (desired wave) and an unnecessary signal (unnecessary wave) in a mixed state. Since the amplitude of the unnecessary signal is generally about 100 to 500 times the amplitude of the desired signal, a high performance is required for the detection device 30. Examples of the unnecessary signal include an unnecessary signal caused by mechanical vibration leakage, an unnecessary signal caused by electrostatic coupling leakage, an unnecessary signal caused by the detuning frequency $\Delta f$, an unnecessary signal caused by the frequency 2fd ($2\omega d$), an unnecessary signal caused by DC offset, and the like. The unnecessary signal caused by mechanical vibration leakage occurs due to the imbalance of the shape of the vibrator 10 and the like. The unnecessary signal caused by electrostatic coupling leakage occurs when the driving signal VD shown in FIG. 1 leaks into input terminals of the signals ISP and ISM and the like through the parasitic capacitors CP and CM.

FIGS. 3A to 3C show Frequency spectra illustrative of unnecessary signal removal. FIG. 3A shows the frequency spectrum before synchronous detection. As shown in FIG. 3A, an unnecessary signal caused by DC offset exists in the detection signal before synchronous detection in the DC frequency band. An unnecessary signal caused by mechanical vibration leakage and the desired signal exist in the fd frequency band.

FIG. 3B shows the frequency spectrum after synchronous detection. The desired signal in the fd frequency band shown in FIG. 3A appears in the DC and 2fd frequency bands after synchronous detection, as shown in FIG. 3B. The unnecessary signal (DC offset) in the DC frequency band shown in FIG. 3A appears in the fd frequency band after synchronous detection, as shown in FIG. 3B. The unnecessary signal (mechanical vibration leakage) in the fd frequency band shown in FIG. 3A appears in the 2fd frequency band after synchronous detection, as shown in FIG. 3B.

FIG. 3C shows the frequency spectrum after filtering. The frequency components of the unnecessary signals in the frequency bands of the frequencies fd, 2fd, and the like can be removed by smoothing (LPF) the signal after synchronous detection using the filter section 110.

In this embodiment, the amplifier circuit 70 includes a first-type operational amplifier OP1, and the filter section 110 includes a second-type operational amplifier OP2.

The first-type operational amplifier OP1 is an operational amplifier of which the thermal noise at the frequency of the carrier signal (e.g., resonance frequency of the vibrator or driving-side resonance frequency) is reduced as compared with the second-type operational amplifier OP2, for example. The second-type operational amplifier OP2 is an operational amplifier of which the flicker noise at the frequency of the desired signal (e.g., maximum frequency in the frequency band of the desired signal) is reduced as compared with the first-type operational amplifier OP1.

Specifically, the frequency of the carrier signal (e.g., several tens of kilohertz to several hundreds of kilohertz) is referred to as f1, the frequency of the desired signal (e.g., several hertz to several hundreds of hertz) is referred to as f2, and the corner frequency of flicker noise and thermal noise is referred to as fcr. In this case, the first-type operational amplifier OP1 satisfies the relationship f1−fcr<fcr−f2, for example. Specifically, the first-type operational amplifier OP1 is sized so that the first frequency f1 is set to be close to the corner frequency fcr. The second-type operational amplifier OP2 satisfies the relationship fcr−f2<f1−fcr, for example. Specifically, the second-type operational amplifier OP2 is sized so that the second frequency f2 is set to be close to the corner frequency fcr.

The channel width and the channel length of the differential-stage transistor of the differential section of the first-type operational amplifier OP1 are respectively referred to as W1$a$ and L1$a$, and the bias current (current value) flowing through the differential section is referred to as Ia. The channel width and the channel length of the differential-stage transistor of the differential section of the second-type operational amplifier OP2 are respectively referred to as W1$b$ and L1$b$, and the bias current flowing through the differential section is referred to as Ib. In this case, the relationship W1$b$×L1$b$>W1$a$×L1$a$ and Ia>Ib is satisfied, for example.

The synchronous detection circuit 100 may include a third-type operational amplifier OP3, for example. The third-type operational amplifier OP3 is an operational amplifier of which the thermal noise at the frequency of the carrier signal is reduced as compared with the second-type operational amplifier OP2 (or the first-type operational amplifier OP1) and the flicker noise at the frequency of the desired signal is reduced as compared with the first-type operational amplifier OP1 (or the second-type operational amplifier OP2). For example, when the channel width and the channel length of the differential-stage transistor of the differential section of the third-type operational amplifier OP3 are respectively referred to as W1$c$ and L1$c$, and the bias current flowing through the differential section is referred to as Ic, the relationship W1$c$×L1$c$>W1$a$×L1$a$ and Ic>Ib is satisfied. Alternatively, the relationship W1$c$×L1$c$>W1$b$×L1$b$ and Ic>Ia may be satisfied.

2. Noise Reduction Method
2.1 Noise Analysis

FIG. 4A shows a configuration example of an operational amplifier used in this embodiment. The operational amplifier includes a differential section 200 and an output section 210.

The differential section 200 includes differential-stage transistors M1 and M2 and active-load-stage transistors M3 and M4. The differential section 200 also includes a bias-stage transistor M5. The differential-stage transistors M1 and M2 are provided between a node N1 and nodes N2 and N3, respectively. Differential input signals IM and IP are input to the gates of the differential-stage transistors M1 and M2. The active-load-stage transistors M3 and M4 are provided between the nodes N2 and N3 and a power supply AGND (first power supply), respectively. The node N2 is connected with the gates of the active-load-stage transistors M3 and M4. The bias-stage transistor M5 is provided between a power supply VDD (second power supply) and the node N1. A bias node N4 of a bias circuit 212 formed of a transistor M8 and a current source IS is connected with the gate of the bias-stage transistor M5. This allows a bias current IBD corresponding to a bias current IBS of the bias circuit 212 to flow through the differential section 200.

The output section 210 includes a drive-stage transistor M6 and a bias-stage transistor M7 provided between the power supply VDD and the power supply AGND. The output node N3 of the differential section 200 is connected with the gate of the drive-stage transistor M6, and the bias node N4 is connected with the gate of the bias-stage transistor M7. A phase-compensation capacitor CF and a resistor RF are provided between the nodes N3 and N5.

The configuration of the operational amplifier according to this embodiment is not limited to the configuration shown in FIG. 4A. FIG. 4A shows an example in which the differential-stage transistors M1 and M2 and the bias-stage transistor M5 are P-type transistors and the active-load-stage transistors M3 and M4 are N-type transistors. Note that the transistors M1, M2, and M5 may be N-type transistors and the transistors M3 and M4 may be P-type transistors. Modifications may also be made such as omitting some of the elements (transistor and capacitor) shown in FIG. 4A or adding another element.

Noise analysis on the operational amplifier shown in FIG. 4A is described below. FIG. 4B shows an small-signal equivalent circuit of the transistor. Since noise is expressed in units of V$^2$ (V$^2$/Hz), the equivalent circuit shown in FIG. 4B is also expressed in units of V$^2$. In the equivalent circuit shown in FIG. 4B, in order to calculate the input-referred noise (gate-referred noise) of the transistor, a voltage source with a noise of Svg=Vn$^2$ is provided at the gate of the transistor. A current source of gm$^2$ (Vgs$^2$+Vn$^2$) and a resistor of 1/gds$^2$ are provided between the drain and the source.

As shown in FIG. 5A, noise is classified as flicker noise (1/f noise) and thermal noise. Flicker noise occurs when electrons are trapped by or released from dangling bonds at the interface between a gate oxide film and a silicon substrate. Flicker noise increases as the frequency decreases. On the other hand, thermal noise occurs due to random movement of electrons when the channel region of the transistor is considered to be a resistor. Thermal noise is proportional to the absolute temperature.

In the input-referred noise equivalent circuit shown in FIG. 4B, flicker noise and thermal noise are respectively calculated by the following equations (1) and (2).

$$Vn^2 = \frac{K}{C_{OX} \times W \times L \times f} \quad (1)$$

$$Vn^2 = \frac{8}{3} \times \frac{k \times T}{g_m} \quad (2)$$

In the equation (1), Cox represents the gate capacitance of the transistor per unit area, W represents the channel width, L represents the channel length, f represents the frequency, and K represents the flicker noise constant depending on the manufacturing process. In the equation (2), gm represents the transconductance, k represents the Boltzmann constant, and T represents the absolute temperature.

In this embodiment, the transfer function is calculated by replacing the operational amplifier circuit shown in FIG. 4A with the equivalent circuit shown in FIG. 4B. In this case, only the higher-order terms accounting for 99% of the whole are derived by numerical analysis on the assumption that the size (W and L), the noise level, and the drain-source current of all the transistors of the operational amplifier are the same. The noise Svg (noise spectrum) of the operational amplifier is calculated by the following equation (3).

$$Svg = V_{n1}^2 + V_{n2}^2 + \frac{g_{m3}^2 \times V_{n3}^2}{g_{m1}^2} + \frac{g_{m3}^2 \times V_{n4}^2}{g_{m1}^2} \quad (3)$$

In the equation (3), Vn1, Vn2, Vn3, and Vn4 represent the gate-noise voltages of the transistors M1, M2, M3, and M4 shown in FIG. 4A, and gm1, gm2, gm3, and gm4 represent the transconductances of the transistors M1, M2, M3, and M4.

As is clearly from the numerical analysis result of the equation (3), most of the noise Svg of the operational amplifier is caused by noise of the differential-stage transistors M1 and M2 and the active-load-stage transistors M3 and M4 of the differential section 200 shown in FIG. 4A. Therefore, the channel widths W and the channel lengths L of the transistors M1, M2, M3, and M4 may be optimized when sizing the operational amplifier.

Flicker noise is analyzed as follows. The gate-noise voltages Vn1, Vn2, Vn3, and Vn4 with regard to flicker noise are calculated by the following equations (4), (5), (6), and (7) from the equation (1).

$$V_{n1} = \left(\frac{K_p}{C_{OX} \times W1 \times L1 \times f}\right)^{\frac{1}{2}} \quad (4)$$

$$V_{n2} = \left(\frac{K_p}{C_{OX} \times W1 \times L1 \times f}\right)^{\frac{1}{2}} \quad (5)$$

$$V_{n3} = \left(\frac{K_n}{C_{OX} \times W3 \times L3 \times f}\right)^{\frac{1}{2}} \quad (6)$$

$$V_{n4} = \left(\frac{K_n}{C_{OX} \times W3 \times L3 \times f}\right)^{\frac{1}{2}} \quad (7)$$

In the equations (4) to (7), W1 and L1 respectively represent the channel width and the channel length of the differential-stage transistors M1 and M2, and W3 and L3 respectively represent the channel width and the channel length of the active-load-stage transistors M3 and M4. Note that the equations (4) to (7) are given on the assumption that the channel width W2 and the channel length L2 of the transistor M2 are the same as the channel width W1 and the channel length L1 of the transistor M1, and the channel width W4 and the channel length L4 of the transistor M4 are the same as the channel width W3 and the channel length L3 of the transistor M3. Kp and Kn respectively represent the process-dependent constants of the P-type transistor and the N-type transistor.

The transconductance gm1(=gm2) of the differential-stage transistors M1 and M2 and the transconductance gm3 (=gm4) of the active-load-stage transistors M3 and M4 are calculated by the following equations (8) and (9).

$$g_{m1} = \left(\frac{2\mu_p \times C_{OX} \times W1}{L1} \times Ids\right)^{\frac{1}{2}} \quad (8)$$

$$g_{m3} = \left(\frac{2\mu_n \times C_{OX} \times W3}{L3} \times Ids\right)^{\frac{1}{2}} \quad (9)$$

In the equations (8) and (9), $\mu p$ and $\mu n$ respectively represent the mobilities of the P-type transistor and the N-type transistor, and Ids represents the drain-source current of the transistor, provided that the transistors M1 to M4 have the same drain-source current Ids.

Flicker noise SvgFlc of the operational amplifier is calculated by the following equation (10) by substituting the equations (4) to (9) into the equation (3).

$$SvgFlc = \frac{2K_p}{C_{OX} \times W1 \times L1 \times f} + \frac{2L1 \times \mu_n \times K_n}{\mu_p \times W1 \times L3^2 \times C_{OX} \times f} \quad (10)$$

Thermal noise is analyzed as follows. The gate-noise voltages Vn1, Vn2, Vn3, and Vn4 with regard to thermal noise are calculated by the following equations (11), (12), (13), and (14) from the equation (2).

$$V_{n1} = \left(\frac{8}{3} \times \frac{k \times T}{g_{m1}}\right)^{\frac{1}{2}} \quad (11)$$

$$V_{n2} = \left(\frac{8}{3} \times \frac{k \times T}{g_{m1}}\right)^{\frac{1}{2}} \quad (12)$$

$$V_{n3} = \left(\frac{8}{3} \times \frac{k \times T}{g_{m3}}\right)^{\frac{1}{2}} \quad (13)$$

$$V_{n4} = \left(\frac{8}{3} \times \frac{k \times T}{g_{m3}}\right)^{\frac{1}{2}} \quad (14)$$

Thermal noise SvgThm of the operational amplifier is calculated by the following equation (15) by substituting the equations (11) to (14) into the equation (3).

$$SvgThm = \frac{16}{3} \times \frac{k \times T}{g_{m1}} + \frac{16}{3} \times \frac{g_{m3} \times k \times T}{g_{m1}^2} \quad (15)$$

The thermal noise SvgThm of the operational amplifier is calculated by the following equation (16) by substituting the equations (8) and (9) into the equation (15).

$$SvgThm = \frac{8}{3} \times \frac{k \times T \times \sqrt{2} \times \sqrt{L1}}{\sqrt{Ids} \times \sqrt{\mu_p \times C_{OX}} \times \sqrt{W1}} + \frac{8}{3} \times \frac{k \times T \times \sqrt{2} \times L1 \times \sqrt{\mu_n \times C_{OX}} \times \sqrt{W3}}{\sqrt{Ids} \times \sqrt{L3} \times \mu_p \times C_{OX} \times W1} \quad (16)$$

When excluding the constant determined by the natural world and the constant which depends only on the process from the equation (10) relating to the flicker noise SvgFlc and the equation (16) relating to the thermal noise SvgThm, W1, W3, L1, L3, and Ids are variables which can be managed in the design stage. Therefore, the flicker noise SvgFlc is reduced by satisfying the following items in view of the equation (10).

(P1) Increase the WL product W1×L1 (gate area) of the differential-stage transistors M1 and M2 as much as possible. This reduces the first term of the equation (10), whereby the flicker noise SvgFlc is reduced.

(P2) Reduce the ratio L1/L3 as much as possible. Specifically, the channel lengths L1 and L3 are set so that L1<L3, for example. This reduces the second term of the equation (10), whereby the flicker noise SvgFlc is reduced. As a result, the WL product W3×L3 of the active-load-stage transistors M3 and M4 increases.

(P3) The flicker noise SvgFlc is independent of the drain-source current Ids. Therefore, when taking only the flicker noise into consideration, power consumption can be reduced by reducing the drain-source current Ids.

As is clear from the above description, the flicker noise SvgFlc and power consumption can be reduced by increasing the WL product W1×L1 of the differential-stage transistor and reducing the bias current IBD (Ids) flowing through the differential section.

The thermal noise SvgThm is reduced by satisfying the following items in view of the equation (16).

(Q1) Increase the current Ids (IBD) as much as possible. This reduces the first and second terms of the equation (16), whereby the thermal noise SvgThm is reduced.

(Q2) Increase the WL ratio RT1=W1/L1 of the differential-stage transistors M1 and M2 as much as possible, and reduce the WL ratio RT3=W3/L3 of the active-load-stage transistors M3 and M4 as much as possible. Specifically, the ratios RT1 and RT3 are set so that RT1>RT3, for example.

(Q3) The thermal noise SvgThm is independent of the WL products W1×L1 and W3×L3. Therefore, when taking only the thermal noise into consideration, the area of the operational amplifier can be reduced by reducing the WL products W1×L1 and W3×L3.

As is clear from the above description, the thermal noise SvgThm and the area of the operational amplifier can be reduced by increasing the bias current IBD flowing through the differential section and reducing the WL products W1×L1 and W3×L3 to provide a small operational amplifier.

2.2 Selective Use of Operational Amplifiers

As is clear from the items (P1) and (Q1), the noise of the operational amplifier can be reduced by increasing the WL product W1×L1 of the differential-stage transistor to reduce flicker noise and increasing the bias current IBD of the differential section to reduce thermal noise.

However, the layout area of the operational amplifier is increased by increasing the WL product W1×L1, whereby the circuit scale is increased. On the other hand, the current consumption of the operational amplifier is increased by increasing the bias current IBD, thereby hindering a reduction in power consumption.

In this embodiment, in order to achieve a reduction in noise, circuit area, and power consumption in combination, the first-type and second-type operational amplifiers OP1 and OP2 are provided and are used selectively.

As transistor noise, flicker noise predominantly occurs in a low frequency region, and thermal noise predominantly occurs in a high frequency region, as shown in FIG. 5A.

As shown in FIG. 5A, the frequency f1 (first frequency) of the amplification target signal (small-signal amplification target signal of the operational amplifier) of the amplifier circuit 70 shown in FIG. 1 is high, and the frequency f2 (second frequency) of the amplification target signal of the filter section 110 is low.

Specifically, the frequency f1 corresponds to the driving-side resonance frequency fd of the gyrosensor. For example, the frequency f1 is a frequency in a band of several tens of kilohertz to several hundreds of kilohertz (AC band). As shown in FIG. 3A, the desired signal (gyrosensor detection signal) is carried using a frequency of f1=fd as the carrier frequency before synchronous detection, for example.

On the other hand, the frequency f2 corresponds to the frequency of the desired signal (maximum frequency in the frequency band of the desired signal). For example, the frequency f2 is a frequency in a band of several hertz to several hundreds of hertz (DC band). As shown in FIG. 3B, the desired signal appears in the band of several hertz to several hundreds of hertz after synchronous detection, for example.

In this embodiment, the first-type operational amplifier OP1 which reduces thermal noise as compared with the second-type operational amplifier OP2 is used in the circuit (e.g., amplifier circuit 70) in the preceding stage of the synchronous detection circuit 100. Specifically, an operational amplifier is used of which the thermal noise at the frequency f1 of the carrier signal is reduced as compared with the second-type operational amplifier OP2.

On the other hand, the second-type operational amplifier OP2 which reduces flicker noise as compared with the first-type operational amplifier OP1 is used in the circuit (e.g., filter section 110) in the subsequent stage of the synchronous detection circuit 100. Specifically, an operational amplifier is used of which the flicker noise at the frequency f2 of the desired signal is reduced as compared with the first-type operational amplifier OP1.

In FIG. 5B, the WL product of the differential-stage transistor of the first-type operational amplifier OP1 is indicated by W1×L1=W1a×L1a, and the bias current flowing through the differential section is indicated by IBD=Ia, for example. The frequency (operating frequency) of the amplification target signal of the first-type operational amplifier OP1 is indicated by fop=f1. The WL ratio of the differential-stage transistor is indicated by RT1=RT1a=W1a/L1a, and the WL ratio of the active-load-stage transistor is indicated by RT3=RT3a=W3a/L3a.

The WL product of the differential-stage transistor of the second-type operational amplifier OP2 is indicated by W1×L1=W1b×L1b, and the bias current flowing through the differential section is indicated by IBD=Ib. The frequency of the amplification target signal of the second-type operational amplifier OP2 is indicated by fop=f2. The channel length ratio of the differential-stage transistor and the active-load-stage transistor is indicated by L1/L3=L1b/L3b. The WL product of the third-type operational amplifier OP3 is indicated by W1×L1=W1c×L1c, and the bias current flowing through the differential section is indicated by IBD=Ic.

In this embodiment, the relationship W1b×L1b>W1a×L1a, Ia>Ib, and f1>f2 is satisfied between the first-type and second-type operational amplifiers OP1 and OP2, as shown in FIG. 5C. The relationship RT1a>RT3a is satisfied for the first-type operational amplifier OP1, and the relationship L1b<L3b is satisfied for the second-type operational amplifier OP2. The relationship W1c×L1c>W1a×L1a and Ic>Ib is satisfied for the third-type operational amplifier OP3. Note that the relationship W1c×L1c>W1b×L1b and Ic>Ia may be satisfied.

For example, flicker noise can be reduced by increasing the WL product W1×L1 of the differential-stage transistor, as shown in FIG. 6A and described in the item (P1), thermal noise can be reduced by increasing the bias current IBD of the differential section, as shown in FIG. 6A and described in the item (Q1). The first-type operational amplifier OP1 has the high signal frequency f1, and the second-type operational amplifier OP2 has the low signal frequency f2.

In this embodiment, as shown in FIG. 6B, thermal noise which predominantly occurs at the high frequency f1 is effectively reduced by increasing the bias current IBD=Ia of the first-type operational amplifier OP1 having the high signal frequency f1, thereby reducing the noise of the entire system. Specifically, the bias current Ia of the first-type operational amplifier OP1 is set to be about twice to ten times, and preferably about four to seven times the bias current Ib of the second-type operational amplifier OP2, for example. On the other hand, since the effect of flicker noise is small at the high frequency f1, the layout area of the operational amplifier is unnecessarily increased when increasing the WL product W1×L1=W1a×L1a of the first-type operational amplifier OP1. This does not contribute to a reduction in the noise of the entire system. In this embodiment, since the WL product W1a×L1a is set to be smaller than the WL product W1b×L1b, a situation in which the layout area is unnecessarily increased can be prevented.

In this embodiment, as shown in FIG. 6C, flicker noise which predominantly occurs at the low frequency f2 is effectively reduced by increasing the WL product W1×L1=W1b×L1b of the second-type operational amplifier OP2 having the low signal frequency f2, thereby reducing the noise of the entire system. Specifically, the WL product W1b×L1b of the second-type operational amplifier OP2 is set to be about 10 to 100 times, and preferably about 30 to 60 times the WL product W1a×L1a of the first-type operational amplifier OP1, for example. On the other hand, since the effect of thermal noise is small at the low frequency f2, the current consumption of the operational amplifier is unnecessarily increased when increasing the bias current IBD=Ib. This contributes to a reduction in power consumption of the entire system to only a small extent. In this embodiment, since the bias current Ib is set to be lower than the bias current Ia, a situation in which the current consumption is unnecessarily increased can be prevented.

In the first-type operational amplifier OP1 mainly aiming at reducing thermal noise, thermal noise can be reduced by increasing the WL ratio RT1a=W1a/L1a as much as possible and reducing the WL ratio RT3a=W3a/L3a as much as possible, as is clear from the equation (16) and the item (Q2). Therefore, the transistors of the first-type operational amplifier OP1 are sized so that the relationship RT1a>RT3a is satisfied. Specifically, the WL ratio RT1a is set to be about twice to eight times, and preferably about three to six times the WL ratio RT3a, for example. This further reduces the noise of the entire system.

In the second-type operational amplifier OP2 mainly aiming at reducing flicker noise, flicker noise can be reduced by reducing the ratio L1b/L3b as much as possible, as is clear from the equation (10) and the item (P2).

Therefore, the transistors of the second-type operational amplifier OP2 are sized so that the relationship L1b<L3b is satisfied. Specifically, the channel length L1b is set to be about 0.4 to 0.8 times the channel length L3b, for example. This further reduces the noise of the entire system.

2.3 Corner Frequency

In this embodiment, the transistors of the first-type and second-type operational amplifiers OP1 and IP2 are sized so that frequencies f1 and f2 and the corner frequency fcr have the relationship shown in FIGS. 6B and 6C, for example.

Specifically, the first-type operational amplifier OP1 is designed so that the relationship f1−fcr<fcr−f2 is satisfied, as shown in FIG. 6B. The second-type operational amplifier OP2 is designed so that the relationship fcr−f2<f1−fcr is satisfied, as shown in FIG. 6C.

The corner frequency fcr is the frequency corresponding to the intersection of the flicker noise characteristic line and the thermal noise characteristic line in the frequency-noise characteristics shown in FIGS. 6A to 6C.

For example, when the corner frequency fcr is set at a position indicated by E1 in the first-type operational amplifier OP1 shown in FIG. 7A, the noise at the frequency f1 increases, whereby thermal noise cannot be effectively reduced. On the other hand, when the corner frequency fcr is set at a position indicated by E2, the bias current IBD unnecessarily increases, thereby hindering a reduction in power consumption.

In this embodiment, the transistors of the first-type operational amplifier OP1 are sized so that the corner frequency fcr is set near the frequency f1. In this case, the thermal noise and the power consumption of the operational amplifier can be reduced optimally by ideally setting the corner frequency fcr to be fcr=f1, as indicated by E3 in FIG. 7A. However, when setting the corner frequency fcr to be fcr=f1, the thermal noise level may exceed the desired noise level when process variation occurs.

In FIG. 6B, the first-type operational amplifier OP1 is designed so that the relationship f1−fcr<fcr−f2 is satisfied, thereby causing the corner frequency fcr to be close to the frequency f1 as much as possible. This makes it possible to reduce the thermal noise and the power consumption of the operational amplifier while taking process variation into consideration.

In the second-type operational amplifier OP2 shown in FIG. 7B, when the corner frequency fcr is set at a position indicated by E4, the noise at the frequency f2 increases, whereby flicker noise cannot be effectively reduced. On the other hand, when the corner frequency fcr is set at a position indicated by E5, the WL product W1×L1 unnecessarily increases, thereby hindering a reduction in circuit area.

In this embodiment, the transistors of the second-type operational amplifier OP2 are sized so that the corner frequency fcr is set near the frequency f2. In this case, the flicker noise and the layout area of the operational amplifier can be reduced optimally by ideally setting the corner frequency fcr to be fcr=f2, as indicated by E6 in FIG. 7B. However, when setting the corner frequency fcr to be fcr=f2, the flicker noise level may exceed the desired noise level when process variation occurs.

In FIG. 6C, the second-type operational amplifier OP2 is designed so that the relationship fcr−f2<f1−fcr is satisfied, thereby causing the corner frequency fcr to be close to the frequency f2 as much as possible. This makes it possible to reduce the thermal noise and the area of the operational amplifier while taking process variation into consideration.

2.4 Effective Gate Voltage

As shown in FIG. 5C and the equation (10), flicker noise can be reduced by increasing the WL product W1b×L1b of the differential-stage transistor as much as possible and reducing the channel length L1b as much as possible. Therefore, it is considered that flicker noise can be efficiently reduced by sizing the transistors so that the WL ratio W1b/L1b is increased.

However, it was found that an effective gate voltage Veff decreases when increasing the WL ratio W1b/L1b to a large extent, thereby resulting in an increase in flicker noise. The effective gate voltage Veff is expressed by the following equation (17).

$$Veff = Vgs - Vth \qquad (17)$$
$$= \left\{ \frac{2 \times Ids}{\mu \times C_{OX} \times RT1b} \right\}^{\frac{1}{2}}$$

Where, Vgs represents the gate-source voltage of the transistor, Vth represents the threshold voltage, Ids represents the drain-source current, μ represents the mobility, Cox represents the gate capacitance per unit area, and RT1b represents the WL ratio of the differential-stage transistor, provided that RT1b=W1b/L1b.

Figure 8A:
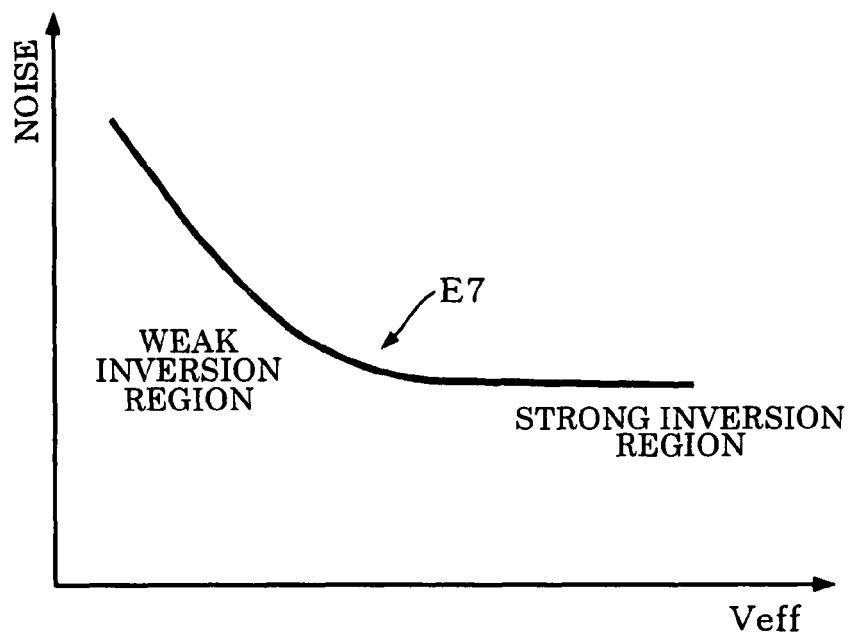
FIGS. 8A and 8B are views illustrative of the relationship between an effective gate voltage and noise.
Figure 8B:
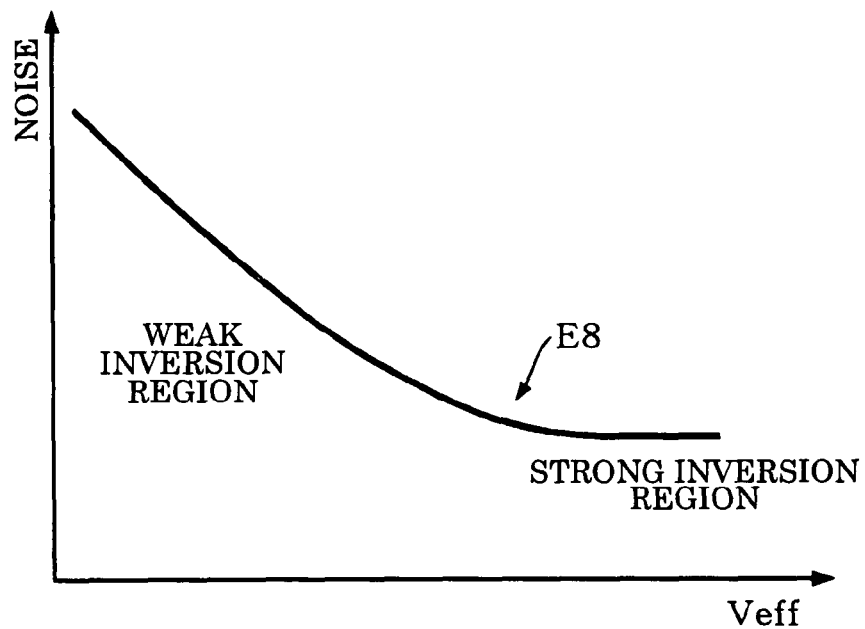

FIGS. 8A and 8B show measurement results of the relationship between the effective gate voltage Veff and noise (noise level Svg), for example. FIG. 8A shows an example of an N-type transistor, and FIG. 8B shows an example of a P-type transistor. In FIGS. 8A and 8B, the effective gate voltage Veff is changed by changing the noise level Vgs. Note that the drain-source voltage Vds is equal to the gate-source voltage Vgs.

As indicated by E7 in FIG. 8A and E8 in FIG. 8B, noise increases steeply when the effective gate voltage Veff decreases. This occurs due to a phenomenon in which the transistor operates in a weak inversion region when the effective gate voltage Veff as the small-signal reference voltage decreases, whereby flicker noise increases rapidly. In FIGS. 8A and 8B, flicker noise increases rapidly at an effective gate voltage Veff of 10 mV to 100 mV, for example. Therefore, in order to suppress an increase in flicker noise due to the operation in the weak inversion region, it is desirable to increase the effective gate voltage Veff to a value greater than 10 mV to 100 mV.

Figure 9A:
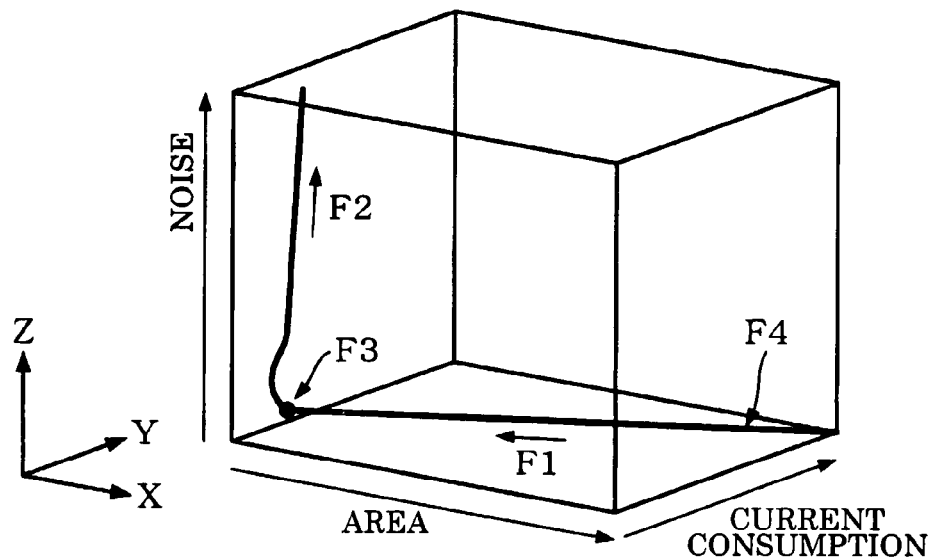
FIGS. 9A and 9B are views illustrative of simulation results according to one embodiment of the invention.

FIG. 9A provides simulation results showing the relationship among the area, current consumption, and noise of the operational amplifier when changing the effective gate voltage Veff, wherein the X axis indicates the area (the length of one side when the operational amplifier is square), the Y axis indicates the current consumption, and the Z axis indicates the noise level.

In FIG. 9A, the effective gate voltage Veff is changed by changing the WL ratio RT1$b$=W1$b$/L1$b$ under conditions where the WL product W1$b$×L1$b$ is constant. For example, the directions indicated by arrows F1 and F2 in FIG. 9A are directions in which the effective gate voltage Veff decreases. The effective gate voltage Veff is reduced by increasing the WL ratio RT1$b$=W1$b$/L1$b$.

As indicated by F1 in FIG. 9A, the area and the current consumption of the operational amplifier decrease as the effective gate voltage Veff decreases. On the other hand, the noise changes to only a small extent.

However, the noise increases rapidly at the point F3 in FIG. 9A. Specifically, when the WL ratio RT1$b$=W1$b$/L1$b$ exceeds a specific value, the transistor operates in the weak inversion region, as described with reference to FIGS. 8A and 8B, whereby flicker noise increases rapidly so that the noise of the operational amplifier increases rapidly.

At a point F4 in FIG. 9A, since the area and the current consumption of the operational amplifier are large although the noise is small, the area and the current are uselessly consumed.

In this embodiment, the WL ratio RT1$b$=W1$b$/L1$b$ of the differential-stage transistor is determined (the range is narrowed) so that the WL ratio RT1$b$ is set at the point F3 in FIG. 9A. For example, the WL ratio RT1$b$ may be a value in the range of 50 to 200. The transistors of the operational amplifier are sized so that the WL product W1$b$×L1$b$ increases and the channel length ratio L1$b$/L3$b$ decreases as shown in FIG. 5C under conditions where the WL ratio RT1$b$ is determined as described above.

Specifically, the transistor is prevented from operating in the weak inversion region by satisfying the following equation (18).

$$Veff = \left\{ \frac{2 \times Ids}{\mu \times C_{OX} \times RT1b} \right\}^{\frac{1}{2}} > \frac{k \times T}{q} \quad (18)$$

Where, k represents the Boltzmann constant, T represents the absolute temperature, and q (=1.602×10$^{-19}$ coulombs) represents the amount of electronic charge k×T/q=25.7 mV at room temperature (25°).

On the other hand, since flicker noise increases at the boundary between the weak inversion region and the strong inversion region, as shown in FIGS. 8A and 8B, it is necessary to take process variation into consideration. Therefore, when process variation parameter (process-dependent parameter) is referred to as P (P>1), the following equation (19) is satisfied.

$$P \times \frac{k \times T}{q} > Veff = \left\{ \frac{2 \times Ids}{\mu \times C_{OX} \times RT1b} \right\}^{\frac{1}{2}} > \frac{k \times T}{q} \quad (19)$$

The process variation parameter P may be set at 3.0, for example. The process variation parameter P may be desirably a value in the range of 1.5 to 2.0.

In this embodiment, the WL ratio RT1$b$=W1$b$/L1$b$ of the differential-stage transistor is determined so that the effective gate voltage Veff is a value in the range which satisfies the equation (19). The transistors of the operational amplifier are sized so that the WL product W1$b$×L1$b$ increases and the channel length ratio L1$b$/L3$b$ decreases under conditions where the WL ratio RT1$b$ is determined as described above. It is desirable to again perform a fine adjustment by changing the WL ratio RT1$b$ after determining the WL ratio RT1$b$ and determining the WL product W1$b$×L1$b$ and the channel length ratio L1$b$/L3$b$.

Figure 9B:
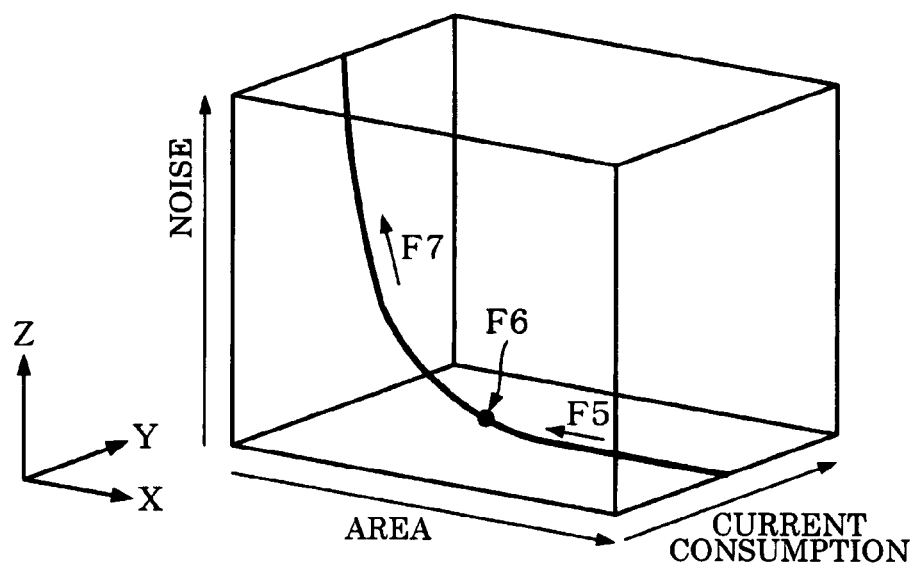

FIG. 9B provides simulation results showing the relationship among the area, current consumption, and noise of the operational amplifier when changing the ratio L1$b$/L3$b$ (L3$b$/L1$b$) which is the ratio of the gate length L1$b$ of the differential-stage transistor and the gate length L3$b$ of the active-load-stage transistor.

When increasing the ratio L1$b$/L3$b$ (reducing the ratio L3$b$/L1$b$), as indicated by F5 in FIG. 9B, noise increases rapidly as indicated by F7 from a point indicated by F6. In this case, the area of the operational amplifier decreases when increasing the ratio L1$b$/L3$b$, but the current consumption changes to only a small extent.

As is clear from the results shown in FIG. 9B, the ratio L1$b$/L3$b$ can be optimally set by setting the ratio L1$b$/L3$b$ at the point indicated by F6. Specifically, the ratio L1$b$/L3$b$ may be a value in the range of 0.4 to 0.8, for example.

According to this embodiment, a reduction in noise, circuit area, and power consumption is successfully achieved in combination by sizing the transistors of the operational amplifier as described above.

Figure 10:
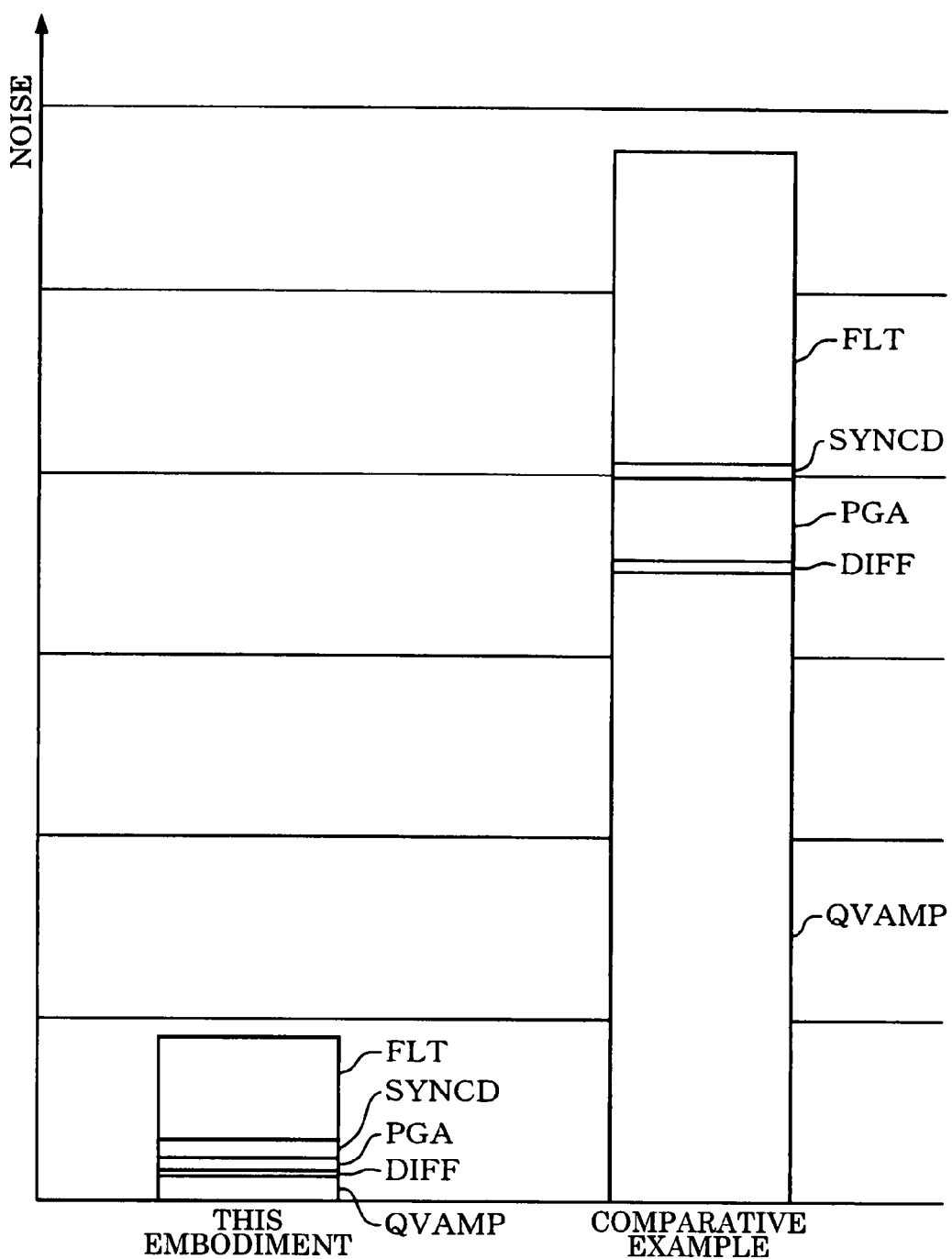
FIG. 10 is a bar graph for comparing one embodiment of the invention and a comparative example in terms of the noise level.

FIG. 10 is a bar graph showing the noise level of each circuit when sizing the transistors of the operational amplifier using the method according to this embodiment and the noise level of each circuit in a comparative example in which sizing using the method according to this embodiment is not performed. In FIG. 10, QVAMP, DIFF, PGA, SYNCD, and FLT respectively indicate the noise levels of the Q/V conversion circuit, the differential amplifier circuit, a sensitivity adjustment circuit described later, the synchronous detection circuit, and the filter section.

As shown in FIG. 10, this embodiment successfully and efficiently reduces the noise of the entire system by selectively using the operational amplifiers for the AC signal circuits and the DC signal circuits to achieve an optimum low-noise design.

2.5 Layout

Figure 11A:
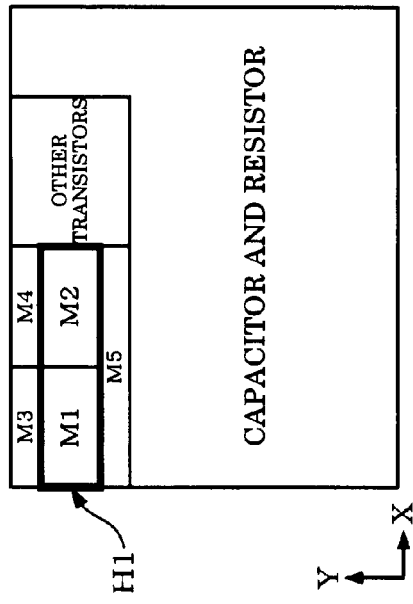
FIGS. 11A and 11B show layout examples of first-type and second-type operational amplifiers.

A layout method for the first-type and second-type operational amplifiers OP1 and OP2 is described below. FIG. 11A shows a layout example of the first-type operational amplifier OP1, and FIG. 11B shows a layout example of the second-type operational amplifier OP2.

Figure 11B:
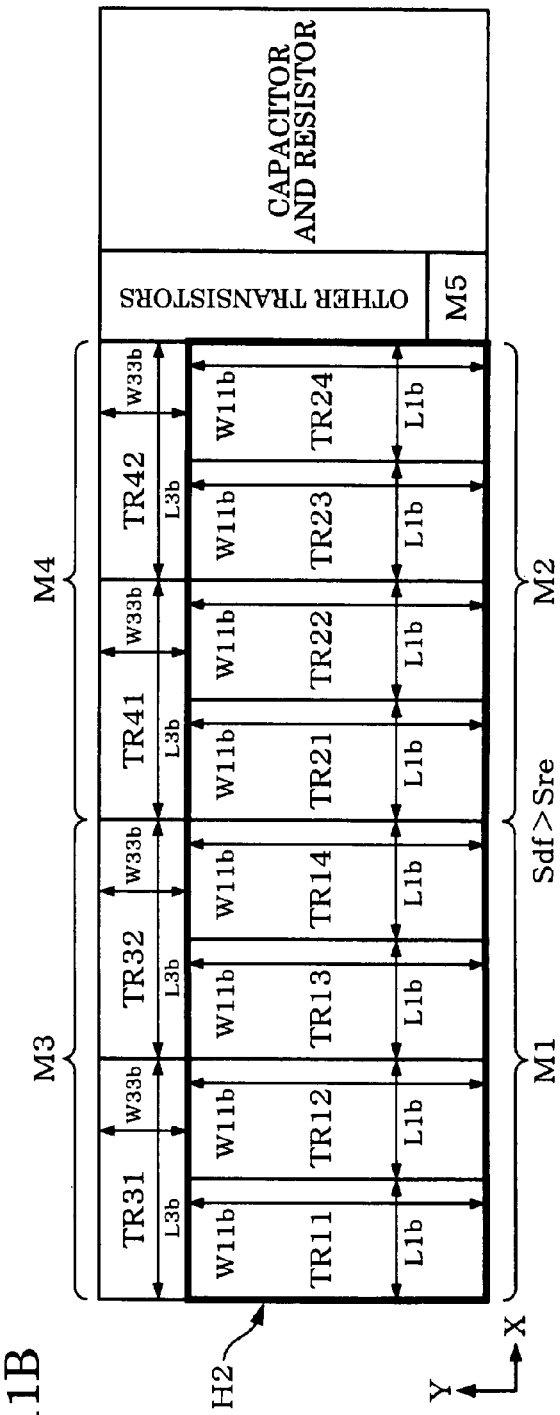

In FIG. 11B, H2 indicates the arrangement region of the differential-stage transistors M1 and M2 among the elements (e.g., transistor, capacitor, and resistor) of the second-type operational amplifier OP2. The area of the arrangement region H2 is referred to as Sdf, and the area of the arrangement region of the elements of the second-type operational amplifier other than the differential-stage transistors M1 and M2 is referred to as Sre. Note that the elements other than the differential-stage transistors M1 and M2 refer to the transistors M3, M4, M5, M6, and M7 other than the transistors M1 and M2, the capacitor CF, the resistor RF, and the like shown in FIG. 4B, for example. In FIG. 1B, the relationship Sdf>Sre is satisfied. The WL product W1b×L1b can be increased by satisfying such a relationship, whereby flicker noise can be reduced.

In the first-type operational amplifier OP1 shown in FIG. 11A, since the arrangement region of the differential-stage transistors M1 and M2 is a small, as indicated by H1, the relationship Sdf>Sre is not satisfied. In the first-type operational amplifier OP1, thermal noise is reduced by sizing the transistors so that the bias current IBD=Ia increases.

In FIG. 1B, the differential-stage transistor M1 of the second-type operational amplifier OP2 includes (J) transistors TR11, TR12, TR13, and TR14 connected in parallel. Likewise, the differential-stage transistor M2 of the second-type operational amplifier OP2 includes transistors TR21, TR22, TR23, and TR24 connected in parallel. The parallel-connected transistors TR11 to TR14 and TR21 to TR24 are disposed in the arrangement region of the differential-stage transistors M1 and M2 indicated by H2.

In FIG. 11B, a direction X is the channel length direction, and a direction Y is the channel width direction. The channel length of each of the parallel-connected transistors TR11 to TR14 and TR21 to TR24 is L1b. When the number of the parallel-connected transistors TR11 to TR14 or TR21 to TR24 is J (J=4 in FIG. 11B), the channel width of each of the transistors TR11 to TR14 and TR21 to TR24 is W1b=W1b/J.

The WL ratio W1b/L1b can be increased while increasing the WL product W1b×L1b by disposing the parallel-connected transistors TR11 to TR14 and TR21 to TR24 as shown in FIG. 11B, whereby flicker noise can be efficiently reduced.

In FIG. 11B, the active-load-stage transistors M3 and M4 respectively include (I) transistors TR31 and TR32 and (I) transistors TR41 and TR42 connected in parallel. The channel length of each of the parallel-connected transistors TR31 and TR32 and the parallel-connected transistors TR41 and TR42 is L3b. When the number of the parallel-connected transistors TR31 and TR32 or TR41 and TR42 is I (I=2 in FIG. 11B), the channel width of each of the transistors TR31 and TR32 and the transistors TR41 and TR42 is W33b=W3b/I.

In FIG. 11B, the J (e.g., J=4) transistors TR11 to TR14 and the J transistors TR21 to TR24 are disposed in the arrangement region of the differential-stage transistors M1 and M2 in the direction X, and the I (I<J; e.g., I=2) transistors TR31 and TR32 and the I transistors TR41 and TR42 are disposed in the arrangement region of the active-load-stage transistors M3 and M4 in the direction X. This enables the transistors TR11 to TR14 and the transistors TR21 to TR24 respectively forming the differential-stage transistors M1 and M2 and the transistors TR31 and TR32 and the transistors TR41 and TR42 respectively forming the active-load-stage transistors M3 and M4 to be efficiently disposed symmetrically in the rectangular arrangement region while satisfying the relationship L1b<L3b described with reference to FIG. 5C. This increases layout efficiency.

Figure 12:
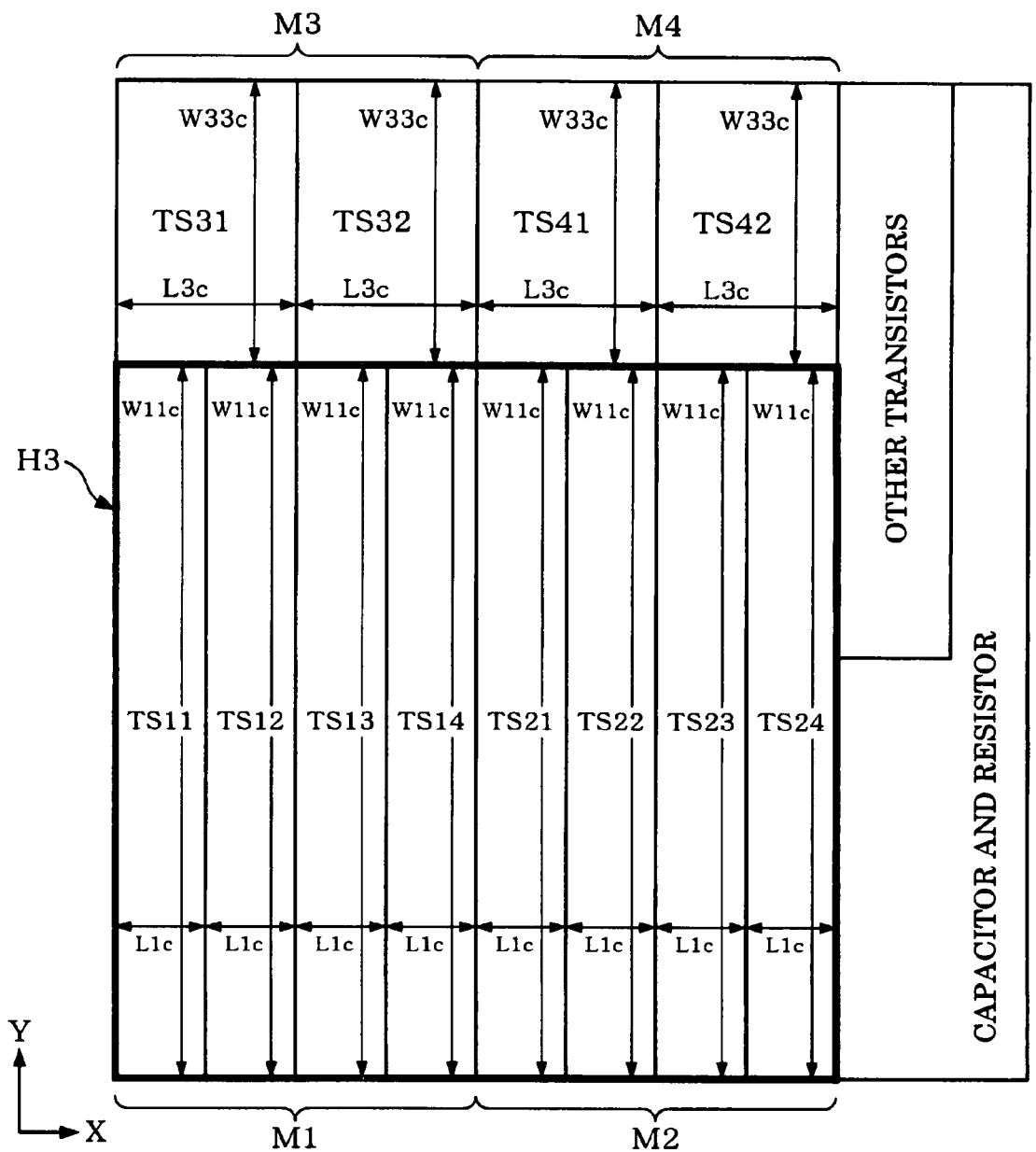
FIG. 12 shows a layout example of a third-type operational amplifier.

FIG. 12 shows a layout example of the third-type operational amplifier OP3. In FIG. 12, H3 indicates the arrangement region of the differential-stage transistors M1 and M2. In FIG. 12, since the relationship Sdf>Sre is satisfied in the same manner as in FIG. 11B, the WL ratio W1c/L1c can be increased. Therefore, flicker noise can be reduced.

In FIG. 12, the differential-stage transistors M1 and M2 respectively include parallel-connected transistors TS11 to TS14 and parallel-connected transistors TS21 to TS24. The (J) parallel-connected transistors TS11 to TS14 and the (J) parallel-connected transistors TS21 to TS24 are disposed in the arrangement region of the differential-stage transistors M1 and M2 indicated by H3.

The channel length of each of the parallel-connected transistors TS11 to TS14 and the parallel-connected transistors TS21 to TS24 is L1c, and the channel width is W11c=W1c/J.

As is clear from the comparison between FIG. 12 and FIG. 11B, the arrangement region H3 of the differential-stage transistors M1 and M2 of the third-type operational amplifier OP3 shown in FIG. 12 is further increased as compared with FIG. 11B. This realizes an operational amplifier which can further reduce flicker noise as compared with FIG. 11B.

3. First Modification

Figure 13:
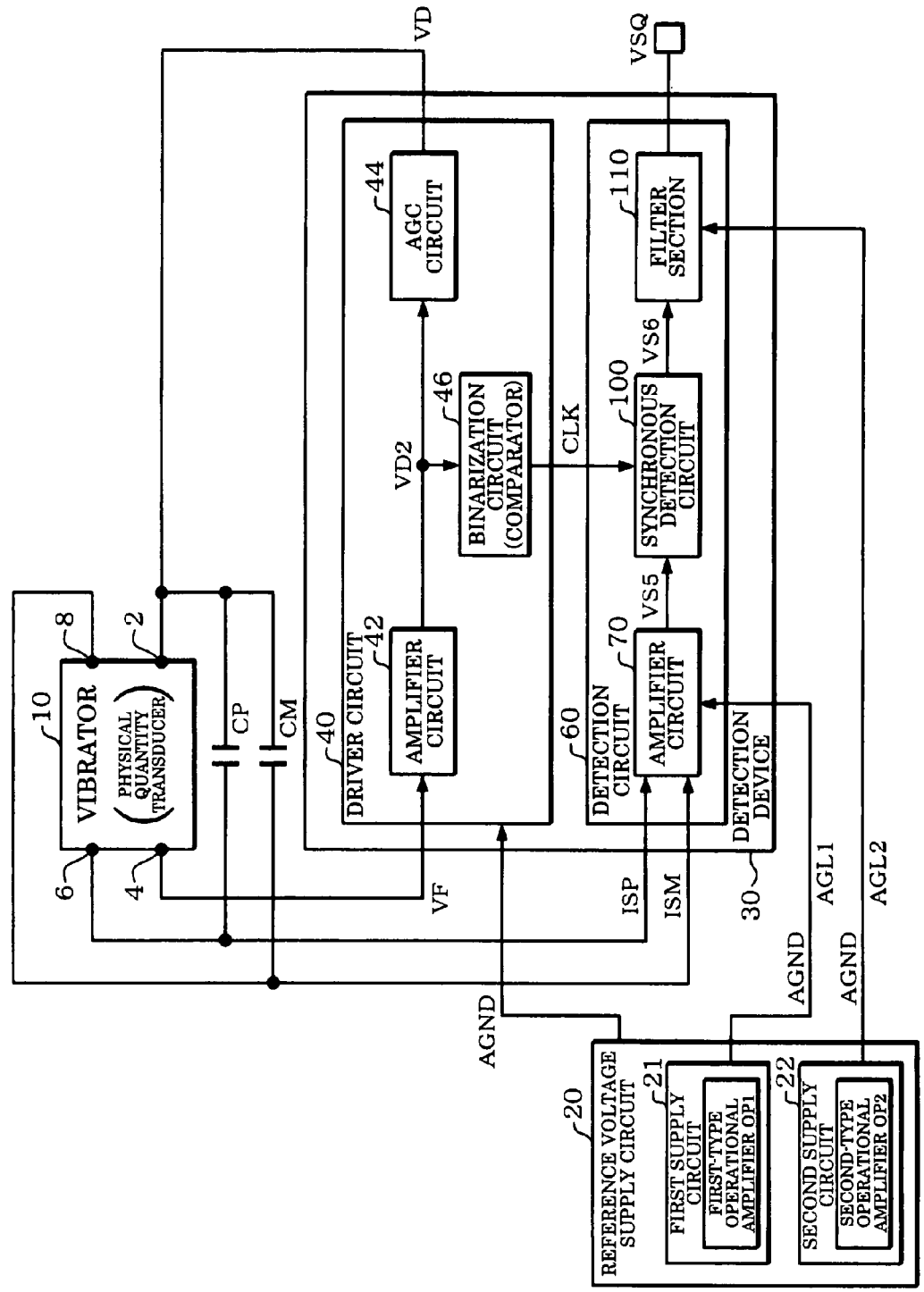
FIG. 13 shows a first modification according to one embodiment of the invention.

FIG. 13 shows a first modification of this embodiment. In FIG. 13, a reference voltage supply circuit 20 is additionally provided in the configuration shown in FIG. 1.

The reference voltage supply circuit 20 supplies the voltage AGND (analog reference voltage in a broad sense) to the detection circuit 60 and the driver circuit 40. The voltage AGND (analog ground) is a voltage used as a reference for the analog circuit. The signal amplification operation of the operational amplifier is performed based on the voltage AGND. Accordingly, the reference voltage supply circuit 20 must supply the voltage AGND at a stable potential to the detection circuit 60 and the driver circuit 40.

The reference voltage supply circuit 20 includes a first supply circuit 21 and a second supply circuit 22. The first supply circuit 21 supplies the voltage AGND (analog reference voltage) to the amplifier circuit 70 of the detection circuit 60. The second supply circuit 22 supplies the voltage AGND to the filter section 110 of the detection circuit 60. The first supply circuit 21 includes a reference-voltage first-type operational amplifier OP1, and the second supply circuit 22 includes a reference-voltage second-type operational amplifier OP2.

The channel width and the channel length of the differential-stage transistor of the differential section of the reference-voltage first-type operational amplifier OP1 are respectively referred to as W1d and L1d, and the bias current flowing through the differential section is referred to as Id. The channel width and the channel length of the differential-stage transistor of the differential section of the reference-voltage second-type operational amplifier OP2 are respectively referred to as W1e and L1e, and the bias current flowing through the differential section is referred to as Ie. In this case, the relationship W1e×L1e>W1d×L1d and Id>Ie is satisfied.

Specifically, the transistors of the reference-voltage first-type operational amplifier OP1 are sized in the same manner as in the first-type operational amplifier included in the detection circuit 60 described with reference to FIGS. 4A to 12. The transistors of the reference-voltage second-type operational amplifier OP2 are sized in the same manner as in the second-type operational amplifier included in the detection circuit 60 described with reference to FIGS. 4A to 12. Specifically, the transistors of the reference-voltage first-type operational amplifier OP1 may be sized so that W1d=W1a and L1d=L1a. The transistors of the reference-voltage second-type operational amplifier OP2 may be sized so that W1e=W1b and L1e=L1b. This also applies to sizing of the active-load-stage transistor.

For example, the frequency f1 of the amplification target signal of the amplifier circuit 70 which operates based on the voltage AGND supplied from the first supply circuit 21 is high, as shown in FIG. 5A, and thermal noise predominantly occurs at the frequency f1, as described above. Therefore, even if the first-type operational amplifier is used as the amplifier circuit 70, thermal noise of the amplifier circuit 70 increases when thermal noise is superimposed on the voltage AGND.

In FIG. 13, the first supply circuit 21 includes the reference-voltage first-type operational amplifier OP1, and supplies the voltage AGND using the reference-voltage first-type operational amplifier OP1. The reference-voltage first-type operational amplifier OP1 is an operational amplifier mainly designed to reduce thermal noise, as described with reference to FIG. 5C and the like. Therefore, thermal noise superimposed on an AGND line AGL1 can be minimized, whereby an increase in thermal noise in the amplifier circuit 70 can be prevented.

The frequency f2 of the amplification target signal of the filter section 110 which operates based on the voltage AGND supplied from the second supply circuit 22 is low, as shown in FIG. 5A, and flicker noise predominantly occurs at the frequency f2, as described above. Therefore, even if the second-type operational amplifier is used as the filter section 110, flicker noise of the filter section 110 increases when flicker noise is superimposed on the voltage AGND.

In FIG. 13, the second supply circuit 22 includes the reference-voltage second-type operational amplifier OP2, and supplies the voltage AGND using the reference-voltage second-type operational amplifier OP2. The reference-voltage second-type operational amplifier OP2 is an operational amplifier mainly designed to reduce flicker noise, as described with reference to FIG. 5C and the like. Therefore, flicker noise superimposed on an AGND line AGL2 can be minimized, whereby an increase in flicker noise in the filter section 110 can be prevented.

The voltage AGND from the first supply circuit 21 is supplied through the AGND line AGL1 (first analog reference voltage line in a broad sense). The voltage AGND from the second supply circuit 22 is supplied through the AGND line AGL2 (second analog reference voltage line in a broad sense). In this case, the AGND lines AGL1 and AGL2 are separately provided from the reference voltage supply circuit 20 to the detection circuit 60. Specifically, the two AGND lines AGL1 and AGL2 are connected with the amplifier circuit 70 and the filter section 110 of the detection circuit 60 while being separated in the layout. This prevents a situation in which noise from the AGND line AGL1 is transmitted to the AGND line AGL2 or noise from the AGND line AGL2 is transmitted to the AGND line AGL1.

For example, when thermal noise from the AGND line AGL2 is transmitted to the AGND line AGL1, the thermal noise from the AGND line AGL2 is transmitted to the amplifier circuit 70, even if the first supply circuit 21 is formed using the first-type operational amplifier OP1 mainly designed to reduce thermal noise, whereby the SNR deteriorates. Likewise, when flicker noise from the AGND line AGL2 is transmitted to the AGND line AGL2, the flicker noise from the AGL1 is transmitted to the filter section 110, even if the second supply circuit 22 is formed using the second-type operational amplifier OP2 mainly designed to reduce flicker noise, whereby the SNR deteriorates.

The above-described situation can be prevented by separately providing the AGND lines AGL1 and AGL2, as shown in FIG. 13, whereby the SNR of the entire system can be increased.

Figure 14:
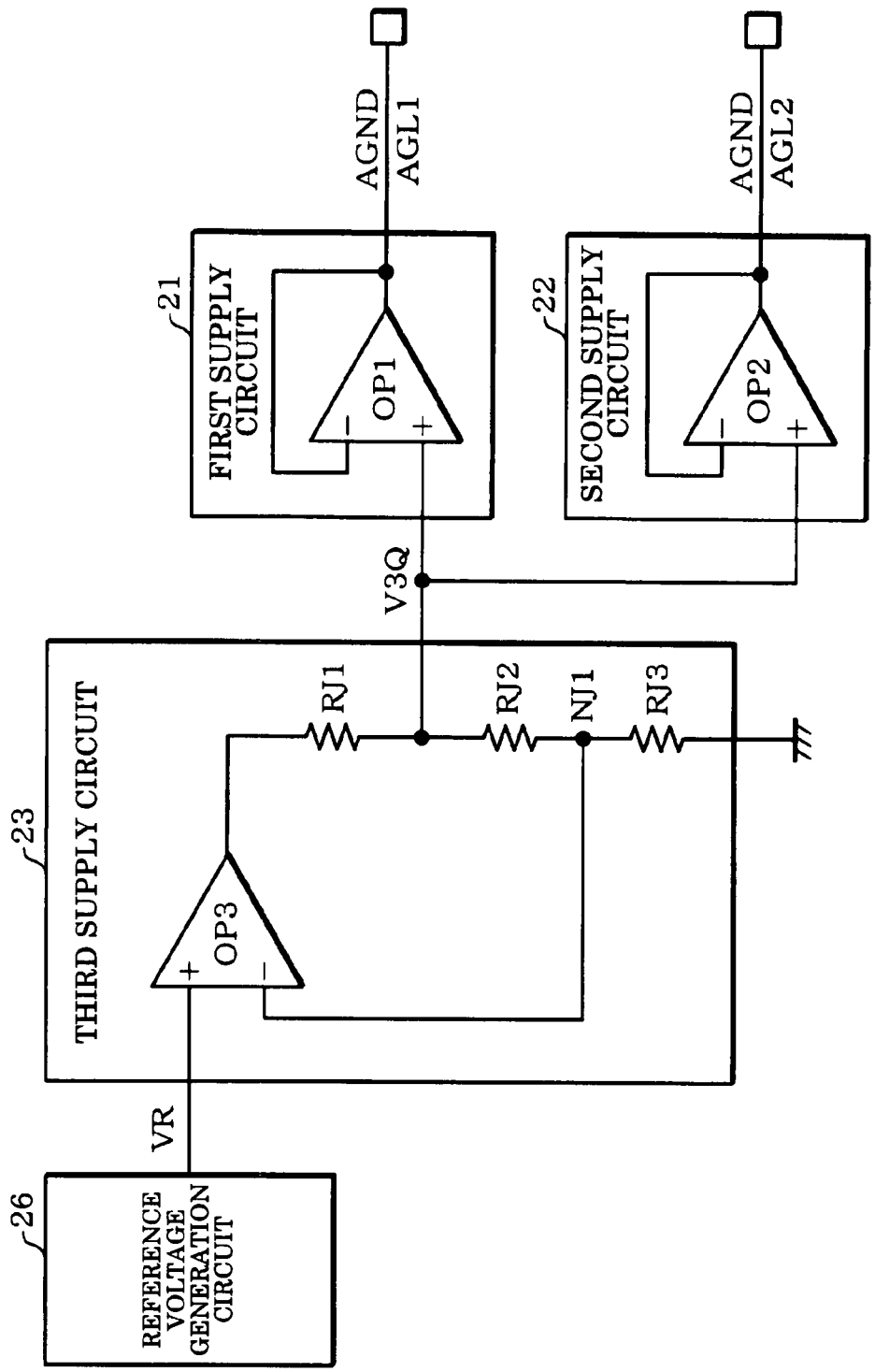
FIG. 14 shows a detailed configuration example of a reference voltage supply circuit.

FIG. 14 shows a detailed configuration example of the reference voltage supply circuit 20. The reference voltage supply circuit 20 is not limited to the configuration shown in FIG. 14. Various modification may be made such as omitting some elements or adding another element.

The reference voltage supply circuit 20 includes first, second, and third supply circuits 21, 22, and 23. The reference voltage supply circuit 20 also includes a reference voltage generation circuit 26.

The first supply circuit 21 (first impedance conversion circuit) performs voltage impedance conversion using a reference-voltage first-type operational amplifier OP1, for example. Specifically, the first-type operational amplifier OP1 included in the first supply circuit 21 is a voltage-follower-connected operational amplifier of which the inverting input terminal (second input terminal in a broad sense) is connected with the output terminal. The output terminal of the first-type operational amplifier OP1 is connected with the AGND line AGL1.

The second supply circuit 22 (second impedance conversion circuit) performs voltage impedance conversion using a reference-voltage second-type operational amplifier OP2, for example. Specifically, the second-type operational amplifier OP2 included in the second supply circuit 22 is a voltage-follower-connected operational amplifier of which the inverting input terminal (second input terminal) is connected with the output terminal. The output terminal of the second-type operational amplifier OP2 is connected with the AGND line AGL2.

The third supply circuit 23 is provided in the preceding stage of the first and second supply circuits 21 and 22, and supplies a voltage V3Q to the first and second supply circuits 21 and 22. The first and second supply circuits 21 and 22 subject the output voltage V3Q from the third supply circuit 23 to impedance conversion and outputs the voltage AGND.

The third supply circuit 23 includes a third-type operational amplifier OP3 described with reference to FIGS. 5C and 12. The third supply circuit 23 may include a voltage divider circuit including resistors RJ1, RJ2, and RJ3.

The reference voltage generation circuit 26 generates a reference voltage VR for generating the voltage AGND. A circuit which generates the reference voltage VR by a band gap may be employed as the reference voltage generation circuit 26, for example.

In FIG. 14, the voltage of a node NJ1 is equal to the reference voltage VR due to a virtual short circuit of the third-type operational amplifier OP3, for example. Therefore, when the resistances of the resistors RJ2 and RJ3 are respectively referred to as R2 and R3, the output voltage of the third supply circuit 23 is $V3Q=VR\times\{(R2+R3)/R3\}$. The first and second supply circuits 21 and 22 subject the output voltage $V3Q\ (=AGND=VR\times\{(R2+R3)/R3\})$ to impedance conversion. This enables the potential of the voltage AGND to be stabilized.

The channel width and the channel length of the differential-stage transistor of the differential section of the reference-voltage third-type operational amplifier OP3 are respectively referred to as $W1f$ and $L1f$, and the bias current flowing through the differential section is referred to as If. In this case, the relationship $W1f\times L1f>W1d\times L1d$ and $If>Ie$ is satisfied.

Specifically, the transistors of the reference-voltage third-type operational amplifier OP3 are sized in the same manner as in the third-type operational amplifier included in the synchronous detection circuit 100 described with reference to FIGS. 4A to 12. Specifically, the differential-stage transistors of the reference-voltage third-type operational amplifier OP3 may be sized so that $W1f=W1c$ and $L1f=L1c$, for example. This also applies to sizing of the active-load-stage transistor.

For example, the first supply circuit 21 receives the output voltage V3Q from the third supply circuit 23, and supplies the voltage AGND to the amplifier circuit 70. Therefore, when thermal noise is superimposed on the output voltage V3Q of the third supply circuit 23, the thermal noise superimposed on the output voltage V3Q is transmitted to the amplifier circuit 70, even if the first-type operational amplifier OP1 mainly designed to reduce thermal noise is used as the first supply circuit 21. As a result, the SNR of the entire system deteriorates.

The second supply circuit 22 receives the output voltage V3Q from the third supply circuit 23, and supplies the voltage AGND to the filter section 110. Therefore, when flicker noise is superimposed on the output voltage V3Q of the third supply circuit 23, the flicker noise superimposed on the output voltage V3Q is transmitted to the filter section 110, even if the second-type operational amplifier OP2 mainly designed to reduce flicker noise is used as the second supply circuit 22. As a result, the SNR of the entire system deteriorates.

The third-type operational amplifier OP3 of the third supply circuit 23 shown in FIG. 14 satisfies the relationship W1f×L1f>W1d×L1d and If>Ie (W1c×L1c>W1a×L1a and Ic>Ib). The third-type operational amplifier OP3 preferably satisfies the relationship W1f×L1f>W1e×L1e and If>Id (W1c×L1c>W1b×L1b and Ic>Ia). Therefore, the third-type operational amplifier OP3 is an operational amplifier with low thermal noise and low flicker noise. For example, the third-type operational amplifier OP3 has a large WL product and a large bias current, as shown in the layout example in FIG. 12. Therefore, the third-type operational amplifier OP3 is an operational amplifier with very low thermal noise and very low flicker noise.

As described above, thermal noise and flicker noise superimposed on the output voltage V3Q of the third supply circuit 23 can be minimized using the third-type operational amplifier OP3 with low thermal noise and low flicker noise as the third supply circuit 23. Therefore, a situation can be minimized in which thermal noise superimposed on the output voltage V3Q is transmitted to the amplifier circuit 70 through the first supply circuit 21 or flicker noise superimposed on the output voltage V3Q is transmitted to the filter section 110 through the second supply circuit 22, whereby the SNR of the entire system can be significantly increased.

4. Second Modification

Figure 15:
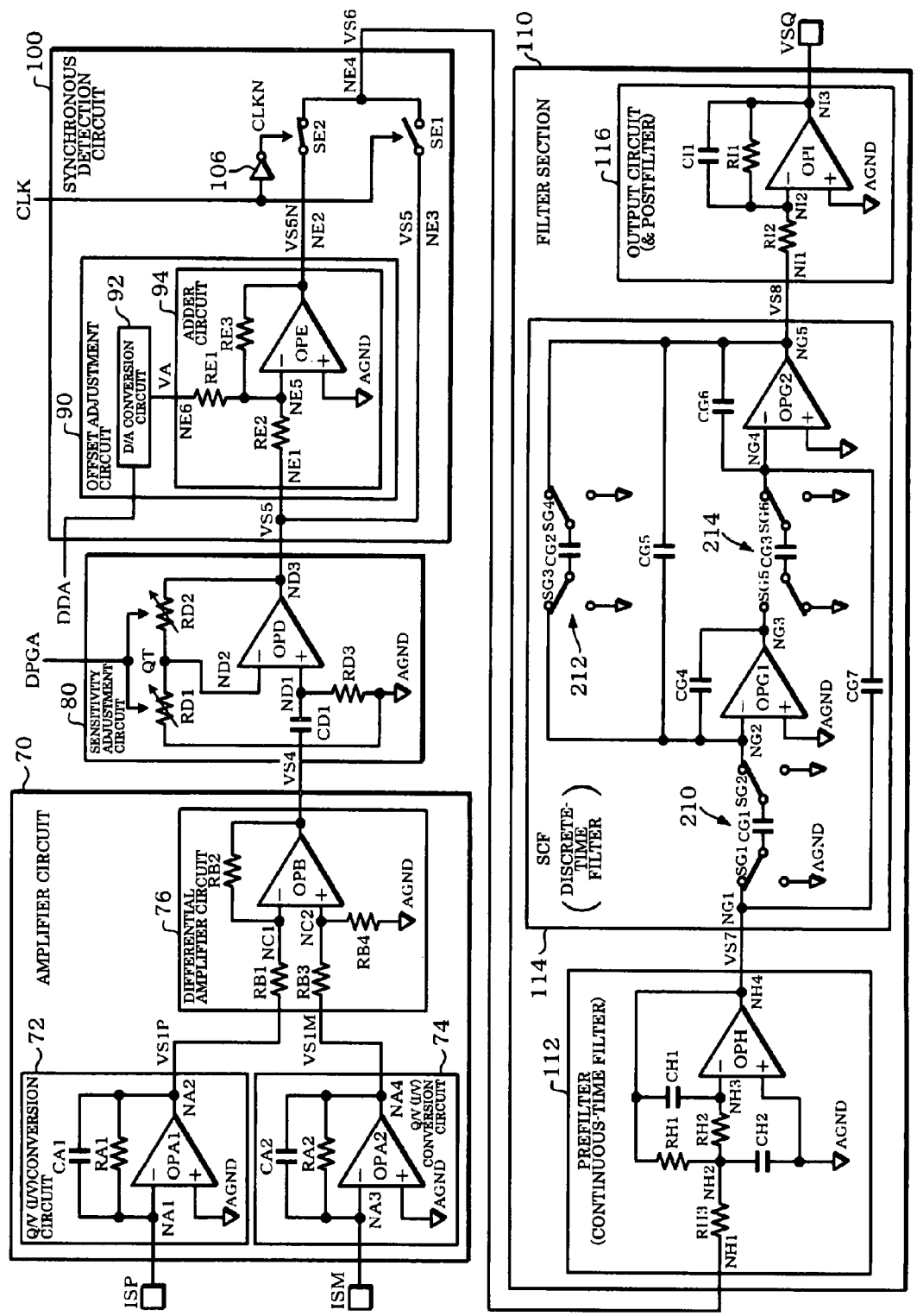
FIG. 15 shows a second modification according to one embodiment of the invention.

FIG. 15 shows a second modification according to this embodiment. The second modification shows a detailed configuration example of the detection circuit 60.

4.1 Amplifier Circuit

The amplifier circuit 70 shown in FIG. 15 includes Q/V conversion circuits 72 and 74 and a differential amplifier circuit 76. The Q/V (I/V) conversion circuits 72 and 74 convert charge (current) generated by the vibrator 10 into voltage. The differential amplifier circuit 76 differentially amplifies output signals VS1P and VS1M from the Q/V conversion circuits 72 and 74.

The Q/V conversion circuit 72 includes a capacitor CA1 and a resistor RA1 provided between nodes NA1 and NA2 and an operational amplifier OPA1, and has low-pass filter frequency characteristics. The input node NA1 is connected with an inverting input terminal (first input terminal) of the operational amplifier OPA1, and the voltage AGND (reference power supply voltage) is connected with a non-inverting input terminal (second input terminal) of the operational amplifier OPA1. The Q/V conversion circuit 74 has the same configuration as the Q/V conversion circuit 72.

When causing the circuits 72 and 74 shown in FIG. 15 to function as the Q/V conversion circuits (charge/voltage conversion circuits), the capacitance of the capacitor CA1 and the resistance of the resistor RA1 are set so that a cut-off frequency fc=1/2πCR is sufficiently lower than the driving frequency fd. This causes the phase to shift by about −90 degrees (90 deg) at the resonance frequency fd.

When causing the circuits 72 and 74 to function as the I/V conversion circuits (current/voltage conversion circuits), the capacitance of the capacitor CA1 and the resistance of the resistor RA1 may be set so that the cut-off frequency fc=1/2πCR is sufficiently higher than the driving frequency fd.

The differential amplifier circuit 76 includes resistors RB1, RB2, RB3, and RB4 and an operational amplifier OPB. The differential amplifier circuit 76 amplifies the difference between the input signals VS1P and VS1M with opposite phases by equalizing the resistance ratio of the resistors RB1 and RB2 and the resistance ratio of the resistors RB3 and RB4. Unnecessary signals due to common mode noise, electrostatic coupling leakage, and the like input from the vibrator 10 to the Q/V conversion circuits 72 and 74 can be removed by differential amplification.

In this embodiment, the Q/V conversion circuits 72 and 74 (first and second charge/voltage conversion circuits or first and second current/voltage conversion circuits) and the differential amplifier circuit 76 are formed using the first-type operational amplifiers OP1 described with reference to FIGS. 5C and 11A. Specifically, the first-type operational amplifiers OP1 are used as the operational amplifiers OPA1, OPA2, and OPB shown in FIG. 15.

Specifically, the first-type operational amplifiers OP1 mainly designed to reduce thermal noise are used as the operational amplifiers OPA1, OPA2, and OPB of the Q/V conversion circuits 72 and 74 and the differential amplifier circuit 76 which amplify a signal in a high frequency band (driving-side resonance frequency band) in which thermal noise predominantly occurs. As a result, thermal noise of the Q/V conversion circuits 72 and 74 and the differential amplifier circuit 76 can be minimized, whereby the SNR of the entire system can be increased.

4.2 Sensitivity Adjustment Circuit

In FIG. 15, the detection circuit 60 includes a sensitivity adjustment circuit 80 which is provided in the preceding stage of the synchronous detection circuit 100 and adjusts the sensitivity (the amount of change in output voltage per unit angular velocity) by variably controlling the gain.

A sensitivity adjustment is performed for the signal having the frequency fd instead of the DC signal by providing the sensitivity adjustment circuit 80 (programmable gain amplifier) in the preceding stage of the synchronous detection circuit 100. Therefore, an adverse effect of flicker noise (1/f noise) which is reduced as the frequency increases can be minimized. Moreover, since the number of circuit blocks provided in the preceding stage of the sensitivity adjustment circuit 80 is reduced in comparison with the case of providing the sensitivity adjustment circuit in the subsequent stage of the filter section 110, deterioration in SNR which occurs when the sensitivity adjustment circuit 80 amplifies noise generated by these circuit blocks can be minimized.

The sensitivity adjustment circuit 80 shown in FIG. 15 is an example of a non-inverting amplifier circuit. Note that an inverting amplifier circuit may be used as the sensitivity adjustment circuit 80. The sensitivity adjustment circuit 80 shown in FIG. 15 operates as a programmable-gain amplifier (PGA) and a high-pass filter. An operational amplifier OPD (first-type operational amplifier) is used in common by the high-pass filter (active filter) and the programmable-gain amplifier.

In the sensitivity adjustment circuit 80, the resistance of a variable resistor RD2 between an output node ND3 and an output tap QT and the resistance of a variable resistor RD1 between the output tap QT and a node of the voltage AGND are variably controlled based on sensitivity adjustment data DPGA. This allows the gain of the sensitivity adjustment circuit 80 to be adjusted, whereby the sensitivity is adjusted. For example, when the resistances of the variable resistors RD1 and RD2 are respectively referred to as R1 and R2, the gain of the sensitivity adjustment circuit 80 (PGA) is G=(R1+R2)/R1.

Figure 16A:
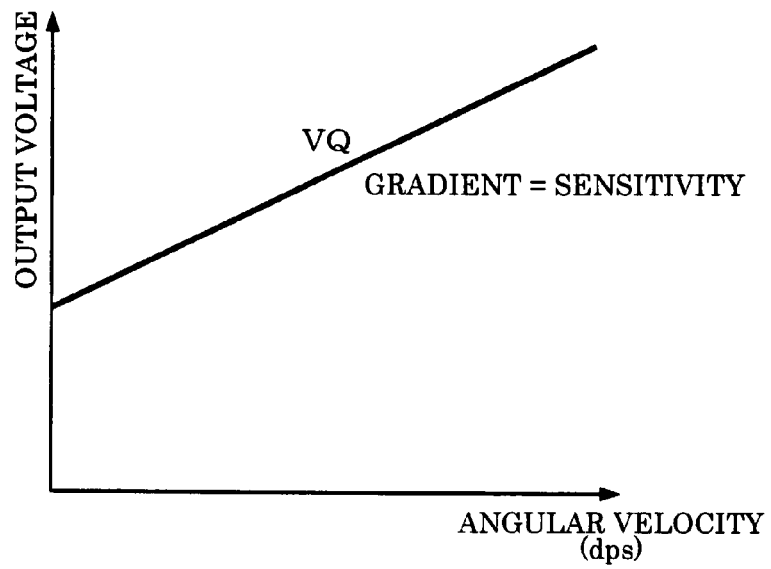
FIGS. 16A and 16B are views illustrative of sensitivity adjustment and offset adjustment.

The sensitivity is adjusted as follows using the sensitivity adjustment circuits 80. As shown in FIG. 16A, the output voltage VQ of the detection device 30 is monitored after manufacturing the gyrosensor. The gyrosensor is rotated from a stationary state at a given rotation angular velocity, and the sensitivity is determined which is the amount of change in the output voltage VQ (slope of the straight line shown in FIG. 16A) during rotation. The adjustment data DPGA for causing the determined sensitivity to coincide with the reference sensitivity is written into a nonvolatile memory (not shown) or the like. The sensitivity adjustment circuit 80 then adjusts the gain of the operational amplifier based on the adjustment data DPGA so that the sensitivity of the detection device 30 coincides with the reference sensitivity.

The sensitivity adjustment circuit 80 shown in FIG. 15 operates as a programmable-gain amplifier and a high-pass filter, for example. Specifically, a capacitor CD1, a resistor RD3, and an operational amplifier OPD form a high-pass active filter. Specifically, the operational amplifier OPD functions as a buffer for the high-pass filter formed of the capacitor CD1 and the resistor RD3. A programmable-gain amplifier is formed of the variable resistors RD1 and RD2 and the operational amplifier OPD. Specifically, the operational amplifier OPD is used in common by the high-pass active filter and the programmable-gain amplifier.

The DC component can be cut off by causing the sensitivity adjustment circuit 80 to operate as the high-pass filter, whereby a situation can be prevented in which the DC signal is amplified by the programmable-gain amplifier (PGA). Therefore, a problem can be prevented in which the programmable-gain amplifier of the sensitivity adjustment circuit 80 or the operational amplifier in the subsequent stage (e.g. operational amplifier of the synchronous detection circuit) is saturated due to overinput, whereby the output overflows. Moreover, DC noise can be removed by the high-pass filter, whereby the SNR can be increased.

In the sensitivity adjustment circuit 80, the operational amplifier OPD is used in common by the high-pass active filter and the programmable-gain amplifier. Therefore, the number of operational amplifiers can be reduced as compared with the case of separately providing an operational amplifier for the active filter and an operational amplifier for the programmable-gain amplifier. Therefore, the circuit scale can be reduced. Moreover, since the number of circuit blocks as the noise source can be reduced, the SNR can be increased.

In this embodiment, the sensitivity adjustment circuit 80 shown in FIG. 15 is formed of a first-type operational amplifier OP1. Specifically, the operational amplifier OPD of the sensitivity adjustment circuit 80 used in common by the high-pass filter and the programmable-gain amplifier is formed of a first-type operational amplifier OP1.

Specifically, the first-type operational amplifier OP1 mainly designed to reduce thermal noise is used as the operational amplifier OPD of the sensitivity adjustment circuit 80 which processes a signal in a high frequency band (driving-side resonance frequency band) in which thermal noise predominantly occurs. As a result, thermal noise of the sensitivity adjustment circuit 80 can be minimized, whereby the SNR of the entire system can be increased.

4.3 Synchronous Detection Circuit

The synchronous detection circuit 100 performs synchronous detection based on the synchronization signal CLK from the driver circuit 40. The synchronous detection circuit 100 includes a switching element SE1 ON/OFF-controlled based on the synchronization signal CLK, and a switching element SE2 IN/OFF-controlled based on an inversion synchronization signal CLKN. The synchronous detection circuit 100 performs synchronous detection using a single balanced mixer method. A signal VS5 is input to the switching element SE1, and an inversion signal VS5N of the signal VS5 is input to the switching element SE2.

Figure 17:
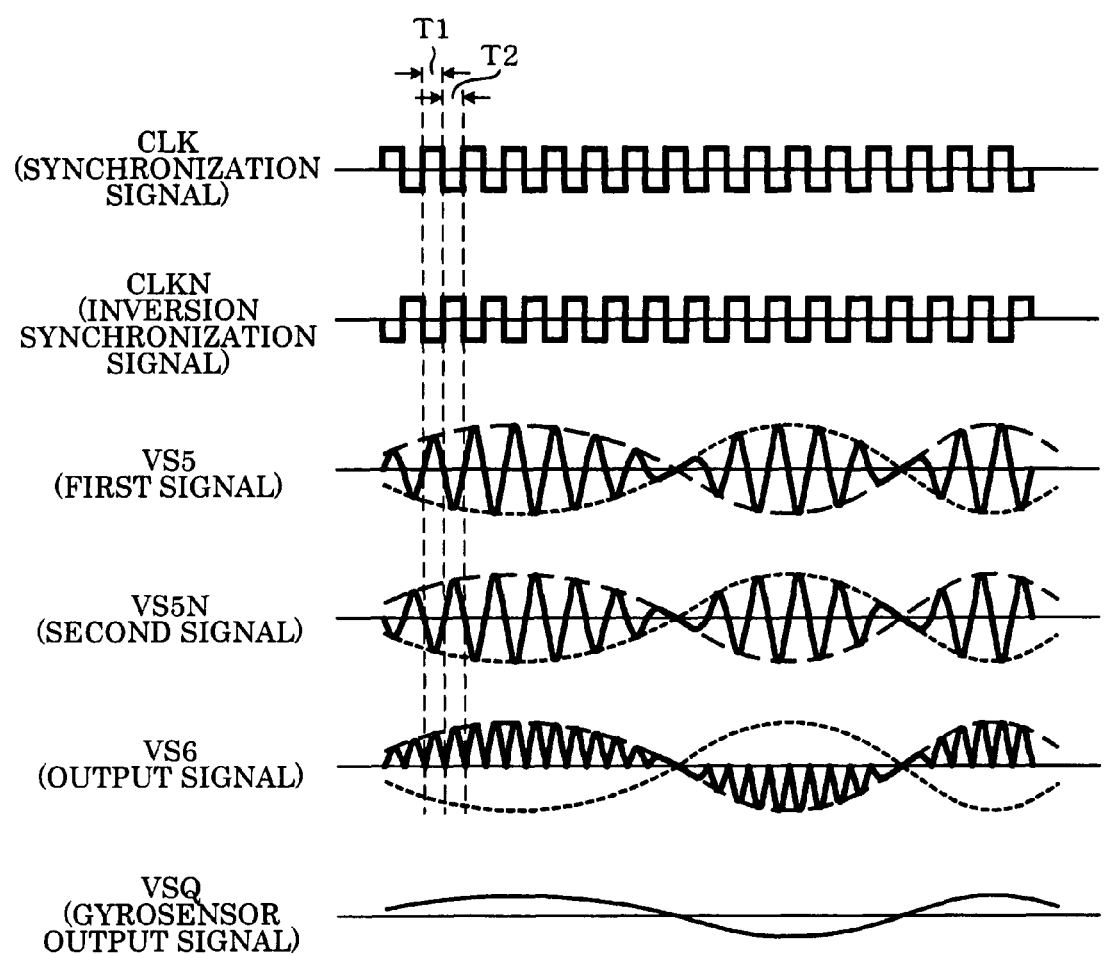
FIG. 17 shows a signal waveform example illustrative of synchronous detection.

FIG. 17 shows a signal waveform example illustrative of synchronous detection. As shown in FIG. 17, the input signal VS5 is output to the output terminal as the signal VS6 in a first period T1 in which the synchronization signal CLK is set at the H level, and the inversion signal VS5N of the input signal VS5 is output to the output terminal as the signal VS6 in a second period T2 in which the synchronization signal CLK is set at the L level. The gyrosensor output signal (desired signal) can be detected and extracted by synchronous detection. Note that the synchronous detection circuit 100 may utilize a double balanced mixer method.

Figure 16B:
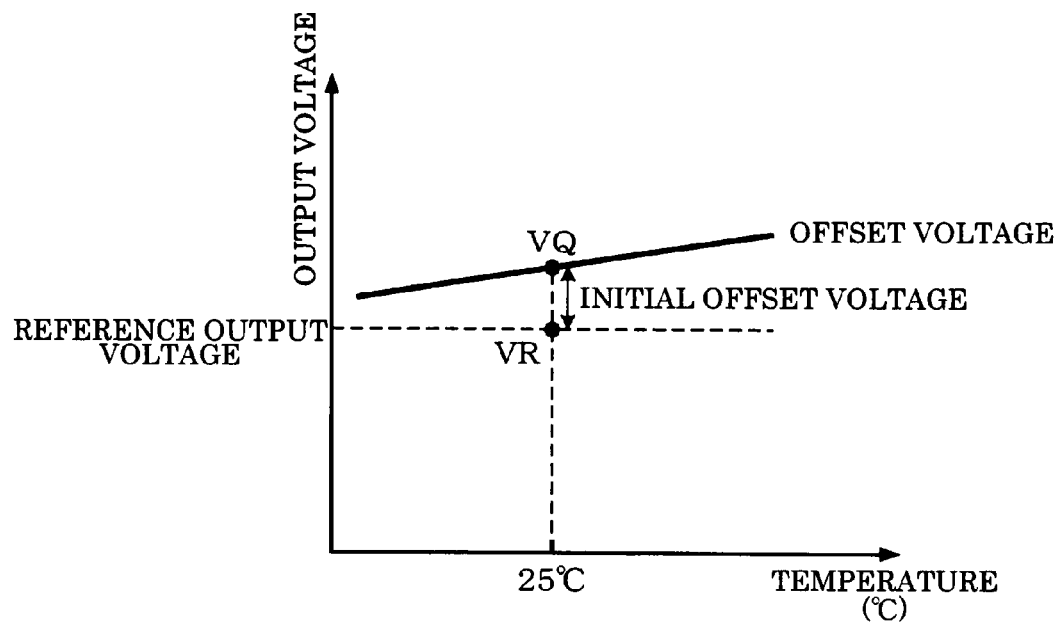

In FIG. 15, the synchronous detection circuit 100 includes an offset adjustment circuit 90 (zero-point adjustment circuit). The offset adjustment circuit 90 removes an initial offset voltage (offset voltage) of the output signal VSQ of the detection device 30, as shown in FIG. 16B. For example, the offset adjustment circuit 90 performs an offset adjustment process so that the voltage of the output signal VSQ coincides with the reference output voltage at a typical temperature of 25° C.

The offset adjustment circuit 90 includes a D/A conversion circuit 92 and an adder circuit (adder-subtracter circuit) 94. The D/A conversion circuit 92 converts initial offset adjustment data DDA into an analog initial offset adjustment voltage VA.

The adder circuit 94 adds the adjustment voltage VA from the D/A conversion circuit 92 to the voltage of the input signal VS5. The adder circuit 94 includes resistors RE1, RE2, and RE3 respectively provided between a node NE5 and nodes NE6, NE1, and NE2. The adder circuit 94 also includes an operational amplifier OPE of which the inverting input terminal is connected with the node NE5 and the noninverting input terminal is connected with a node of the voltage AGND.

As shown in FIG. 16B, the voltage of the output signal VSQ of the detection device 30 is monitored after manufacturing the gyrosensor, for example. The initial offset adjustment data for causing the voltage of the output signal VSQ to coincide with the reference output voltage is written into a nonvolatile memory (not shown) or the like. The adjustment data DDA written into the nonvolatile memory or the like is input to the D/A conversion circuit 92, and the D/A conversion circuit 92 outputs the initial offset adjustment voltage VA corresponding to the adjustment data DDA. The adder circuit 94 removes the initial offset voltage by adding the adjustment voltage VA to the voltage of the input signal VS5.

For example, the resistances of the resistors RE1, RE2, and RE3 of the adder circuit 94 are equal. The voltage of the input signal VS5 is referred to as V1, the initial offset adjustment voltage is referred to as VA, and the output voltage of the adder circuit 94 is referred to as V2. In this case, V2=−(V1+VA) is satisfied. Therefore, when the synchronization signal CLK is set at the H level so that the switching element SE1 is turned ON and the switching element SE2 is turned OFF, the voltage V1 of the input signal VS5 is output from the synchronous detection circuit 100. When the synchronization signal CLK is set at the L level so that the switching element SE1 is turned OFF and the switching element SE2 is turned ON, the voltage V2=−(V1+VA) is output from the synchronous detection circuit 100. Specifically, an inversion signal of the signal obtained by adding the adjustment voltage VA to the voltage V1 of the input signal VS5 is output. This allows addition of the adjustment voltage and synchronous detection to be achieved.

In this embodiment, the synchronous detection circuit 100 is formed of a third-type operational amplifier OP3 described with reference to FIGS. 5B, 5C, and 12. Specifically, the third-type operational amplifier OP3 is used as the operational amplifier OPE of the offset adjustment circuit 90 of the synchronous detection circuit 100.

For example, the synchronous detection circuit 100 functions as a mixer (frequency conversion circuit). Therefore, a low-frequency signal and a high-frequency signal exist in the synchronous detection circuit 100 in a mixed state. For example, the signals VS5 and VS5N are high-frequency AC signals, and the adjustment voltage VA of the offset adjustment circuit 90 is a DC signal. Therefore, the operational amplifier OPE of the synchronous detection circuit 100 processes a low-frequency signal and a high-frequency signal as the amplification target signals. Accordingly, thermal noise and flicker noise must be taken into consideration for the operational amplifier OPE.

In this embodiment, the third-type operational amplifier OP3 with low thermal noise and low flicker noise is used as the operational amplifier OPE. Therefore, even if a low-frequency signal and a high-frequency signal exist as the amplification target signals in a mixed state, a low-noise signal amplification can be realized, whereby the SNR of the entire system can be increased.

In FIG. 15, a modification may be made in which the offset adjustment circuit 90 is not provided in the synchronous detection circuit 100. In this case, the third-type operational amplifier OP3 may be used as an inverting amplifier for generating the inversion signal VS5N of the input signal VS5.

4.4 Detuning Frequency

With regard to the unnecessary signals described with reference to FIGS. 3A to 3C, an unnecessary signal caused by the detuning frequency $\Delta f=|fd-fs|$ occurs when a signal having the detection-side resonance frequency fs is mixed into the gyrosensor detection signal and the resulting detection signal is synchronously detected by the synchronous detection circuit 100. For example, the detection vibrator may be allowed to vibrate (idle) with a small amplitude at the natural resonance frequency fs in order to improve the response of the gyrosensor. Or, the detection vibrator may vibrate at the natural resonance frequency fs when external vibration from the outside of the gyrosensor is applied to the vibrator. When the detection vibrator vibrates at the frequency fs, a signal having the frequency fs is mixed into the signal VS5 input to the synchronous detection circuit 100. Since the synchronous detection circuit 100 performs synchronous detection based on the synchronization signal CLK having the frequency fd, an unnecessary signal having the detuning frequency $\Delta f=|fd-fs|$ corresponding to the difference between the frequencies fd and fs is generated.

Figure 18:
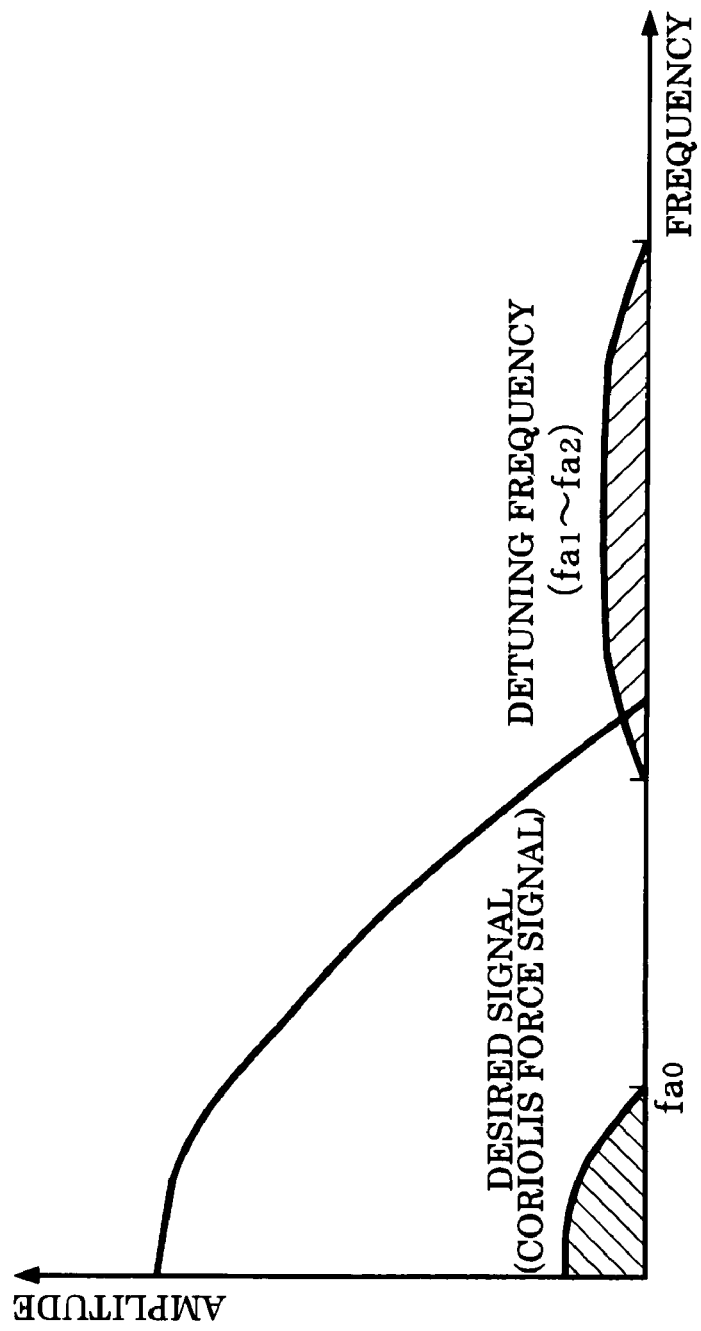
FIG. 18 is a view illustrative of a detuning frequency.

The detuning frequency $\Delta f=|fd-fs|$ is sufficiently lower than the frequencies fd and fs. Therefore, steep attenuation characteristics shown in FIG. 18 are necessary to remove the unnecessary signal of the component having the detuning frequency $\Delta f$. Therefore, it is difficult to remove the unnecessary signal of the component having the detuning frequency $\Delta f$ using only a continuous-time low-pass filter.

In order to solve the above problem, a switched-capacitor filter (SCF) 114 (discrete-time filter) is provided in the filter section 110 in FIG. 15. The SCF 114 has frequency characteristics of removing the component having the detuning frequency $\Delta f=|fd-fs|$ corresponding to the difference between the driving-side resonance frequency fd and the detection-side resonance frequency fs of the vibrator and allowing the frequency component (DC component) of the desired signal to pass through. The filter section 110 also includes a prefilter 112 provided in the preceding stage of the SCF 114, and an output circuit 116 which is provided in the subsequent stage of the SCF 114 and functions as an output buffer and a postfilter. The prefilter 112 and the output circuit 116 are continuous-time filters.

The steep attenuation characteristics shown in FIG. 18 are easily realized by providing the SCF 114 (discrete-time filter in a broad sense) in the filter section 110, as shown in FIG. 15. Therefore, even if the detuning frequency $\Delta f$ is extremely lower than the frequency fd, the component of the unnecessary signal in the frequency band of the detuning frequency $\Delta f$ can be reliably and easily removed without adversely affecting the desired signal in the pass band.

The continuous-time filter has a disadvantage in that the frequency characteristics of the filter vary if the capacitance C of the capacitor and the resistance R of the resistor forming the filter vary, whereby it is difficult to obtain stable frequency characteristics. For example, the absolute values of the capacitance C and the resistance R vary in the range of about ±20%. Since the cut-off frequency of the continuous-time filter (RC filter) is determined by C×R, the cut-off frequency varies to a large extent. If the cut-off frequency varies, the amplitude of the desired signal in the pass band is attenuated or the phase is changed, whereby the signal quality deteriorates.

On the other hand, the filtering characteristics of the SCF 114 can be determined by the capacitance ratio and the sampling frequency (clock frequency). For example, since the accuracy of the capacitance ratio is 0.1% or less, the cut-off frequency varies to only a small extent. Therefore, steep attenuation characteristics of reliably removing the unnecessary signal having the detuning frequency $\Delta f$ while allowing the desired signal in the pass band to pass through can be easily realized using the SCF 114.

As shown in FIG. 15, the SCF 114 includes switched capacitor circuits 210, 212, and 214, capacitors CG4, CG5, CG6, and CG7, and operational amplifiers OPG1 and OPG2. The configuration of the SCF 114 is not limited to the configuration shown in FIG. 15. Various known configurations may be used.

4.5 Frequency Characteristics of Prefilter

When providing the SCF 114 in the filter section 110 as shown in FIG. 15, since the SCF 114 samples the signal in discrete time, aliasing occurs which is a frequency fold-over phenomenon caused by sampling.

In order to prevent an adverse effect of such aliasing, the anti-aliasing prefilter 112 (continuous-time filter in a broad sense) is provided in the preceding stage of the SCF 114 in FIG. 15. Specifically, when the sampling frequency is fsp (=fd), the prefilter 112 has anti-aliasing frequency characteristics of removing frequency components equal to or higher than the frequency fsp/2 (=fd/2).

In this case, the frequency band of the desired signal is fa0 or less (i.e., the frequency of the desired signal is low), as shown in FIG. 18, for example. On the other hand, the sampling frequency fsp of the SCF 114 is 50 to 500 times the frequency fa0 (i.e., the sampling frequency fsp is high), for example. Therefore, steep attenuation characteristics are unnecessary when using a normal anti-aliasing prefilter.

However, it was found that a sensor processing a weak signal such as a gyrosensor cannot remove an unnecessary signal utilizing normal anti-aliasing attenuation characteristics. Specifically, the amplitude of the unnecessary signal included in the gyrosensor detection signal is about 100 to 500 times the amplitude of the desired signal, for example. Therefore, the amplitude of the unnecessary signal becomes higher than the amplitude of the desired signal (DC component) when utilizing normal anti-aliasing attenuation characteristics, whereby the SNR deteriorates due to the fold-over effect on the DC component caused by sampling of the SCF 114, for example.

Therefore, the prefilter 112 (continuous-time filter) preferably has frequency characteristics (filtering characteristics or attenuation characteristics) of attenuating the amplitude of the unnecessary signal, which appears in the frequency band of the frequency k×fd (k is a positive integer) due to synchronous detection by the synchronous detection circuit 100, to a value equal to or smaller than the amplitude of the desired signal (minimum resolution). The amplitude of the desired signal corresponds to the minimum resolution of the desired signal, and corresponds to degrees per second (dps). The amplitude of the desired signal is the amplitude of the desired signal in the DC frequency region.

Therefore, even if the unnecessary signal having an amplitude about 100 to 500 times the amplitude of the desired signal appears at the frequency k×fd, the frequency component of the unnecessary signal can be reliably removed using the prefilter 112.

In FIG. 15, the anti-aliasing prefilter 112 is also used as a filter which removes the unnecessary signal which appears at the frequency k×fd due to synchronous detection. This makes it unnecessary to separately provide a filter which removes the unnecessary signal which appears at the frequency k×fd. Therefore, the circuit scale can be reduced. Moreover, since the number of circuit blocks as the noise source can be reduced, the SNR can be increased.

In order to simplify the system configuration, it is desirable to set the sampling frequency of the SCF 114 at fsp=fd. When the sampling frequency is set at fsp=fd, the unnecessary signal which appears in the fd or 2fd frequency band folds over exactly into the DC frequency band.

On the other hand, the desired signal which exists in the fd frequency band before synchronous detection appears in the DC frequency band after synchronous detection. Therefore, if no measure is taken, the quality of the desired signal in the DC frequency band significantly deteriorates when the unnecessary signal with a large amplitude in the fd or 2fd frequency band folds over. Specifically, when the unnecessary signal in the fd or 2fd frequency band folds over and the unnecessary signal greater than the minimum resolution of the desired signal is superimposed on the DC frequency band, false information indicating that the gyrosensor rotates at a specific angular velocity is provided even if the gyrosensor is in a stationary state.

In order to solve the above problem, the prefilter 112 in the preceding stage of the SCF 114 has the following frequency characteristics in FIG. 15.

Figure 19:
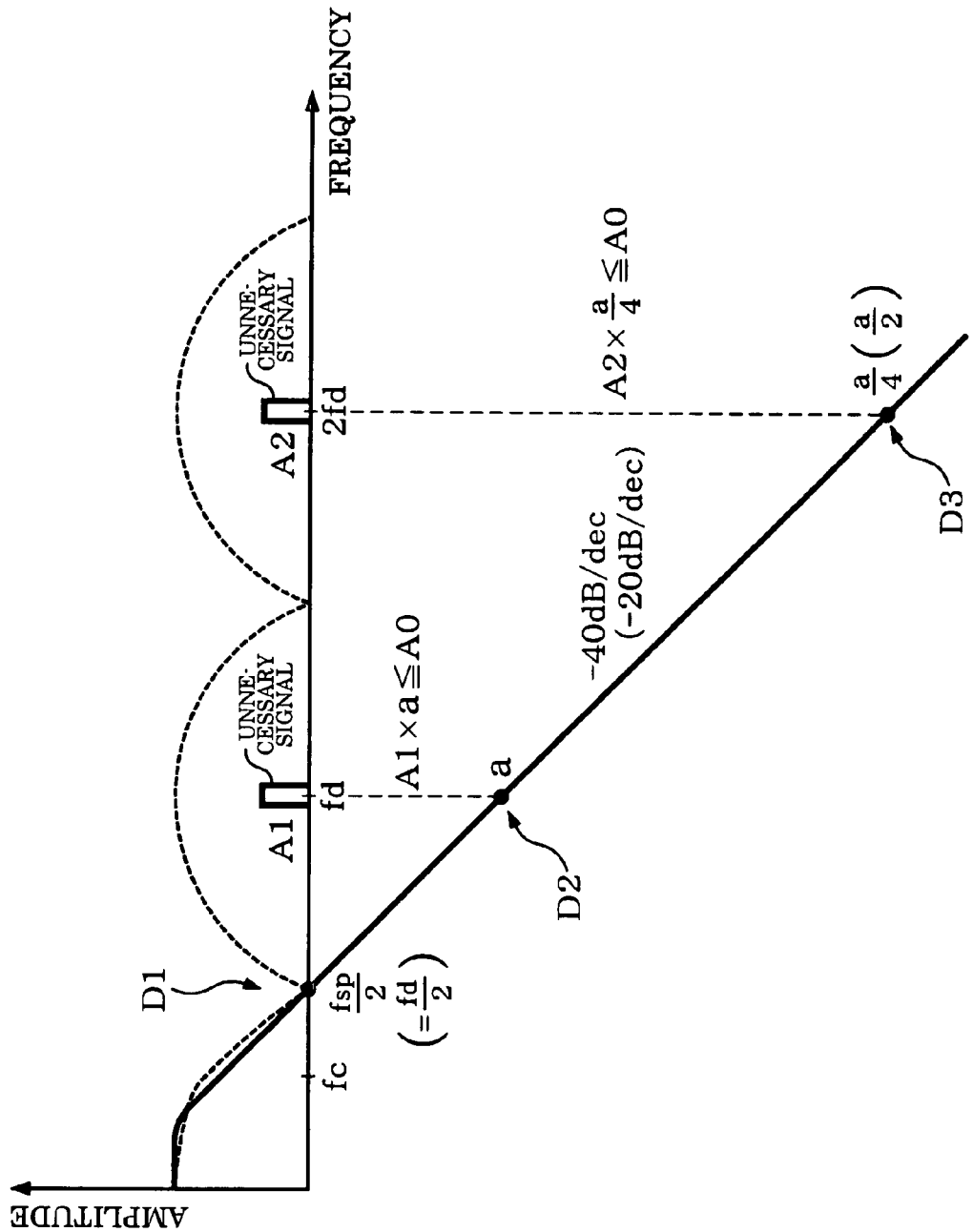
FIG. 19 is a view illustrative of frequency characteristics of a prefilter.
Figure 20:
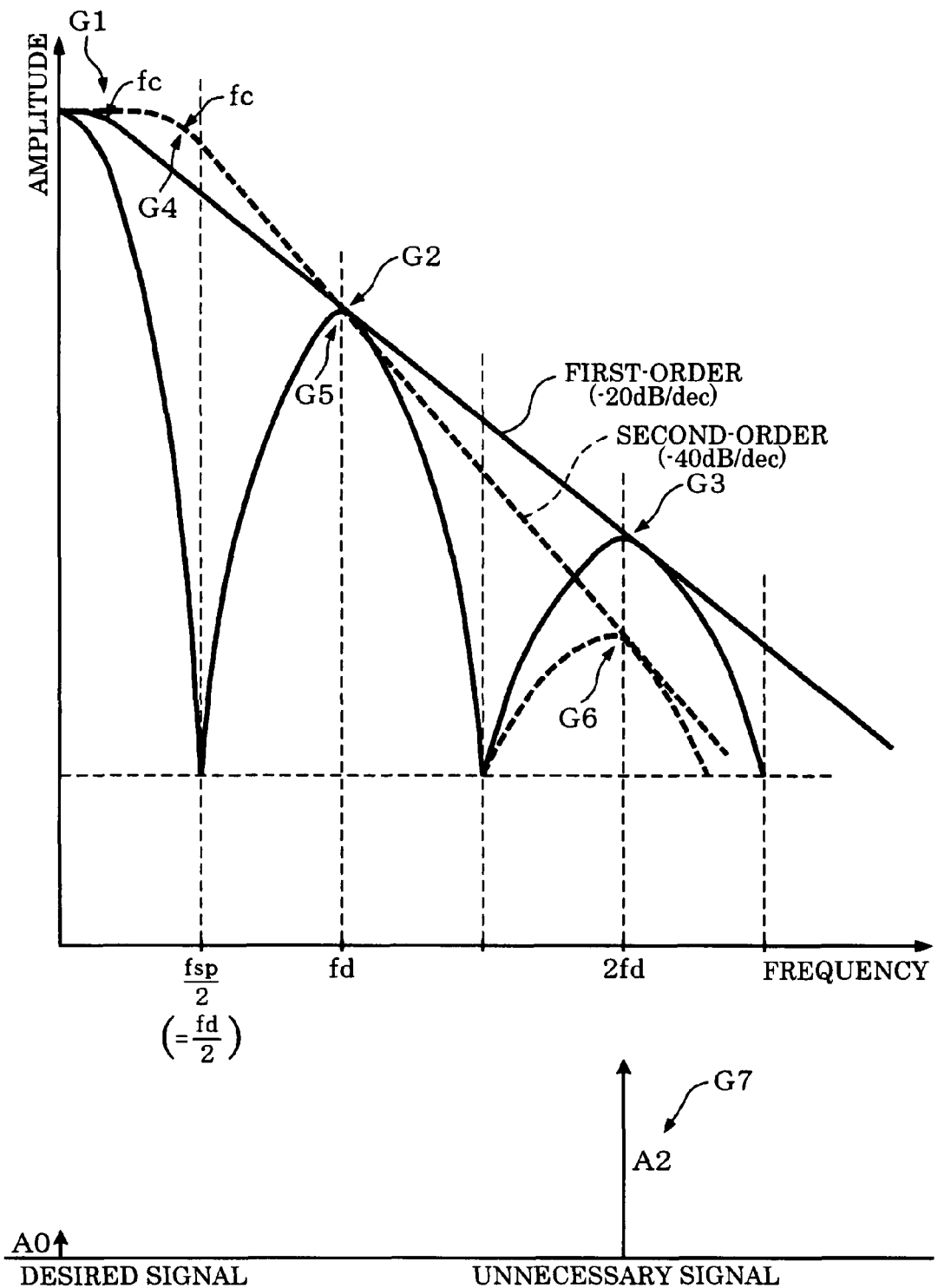
FIG. 20 is a view illustrative of frequency characteristics when using first-order and second-order prefilters.

FIG. 19 schematically shows the frequency characteristics of the prefilter. As indicated by D1 in FIG. 19, the prefilter has sufficient attenuation characteristics at the frequency fsp/2 (=fd/2). Therefore, a situation can be prevented in which random noise (e.g. thermal noise and flicker noise) folds over due to sampling of the SCF 114 to cause the SNR to deteriorate.

When the prefilter 112 is a second-order low-pass filter, the attenuation slope is −40 dB/dec. The amplitude (minimum resolution) of the desired signal (DC component) is referred to as A0, the amplitude of the unnecessary signal which appears at the frequency k×fd (k is a positive integer) is referred to as ΔAk, and the attenuation factor of the filter at the frequency fd is referred to as a. In this case, the prefilter 112 may have frequency characteristics of attenuating the amplitude of the unnecessary signal so that Ak×(a/k$^2$)≦A0 is satisfied.

At D2 in FIG. 19, the amplitude of the unnecessary signal which appears at the frequency fd is A1, and the attenuation factor (attenuation) of the filter at the frequency fd is a. Therefore, A1×a≦A0 is satisfied.

At D3 in FIG. 19, the amplitude of the unnecessary signal which appears at the frequency 2fd is A2, and the attenuation factor of the filter at the frequency 2fd is a/k=a/2$^2$=a/4 since the prefilter 112 is a second-order filter. Therefore, the frequency characteristics are adjusted so that A2×(a/4)≦A0 is satisfied.

Although not shown in FIG. 19, the amplitude of the unnecessary signal which appears at the frequency 3fd is A3, and the attenuation factor of the filter at the frequency 3fd is a/k=a/3$^2$=a/9 since the prefilter 112 is a second-order filter. Therefore, the frequency characteristics are adjusted so that A3×(a/9)≦A0 is satisfied.

If the above conditions are satisfied, the amplitude of the unnecessary signal which appears in the fd, 2fd, or 3fd frequency band can be attenuated to a value equal to or smaller than the amplitude of the desired signal when the prefilter 112 is a second-order low-pass filter.

When the prefilter 112 is a first-order low-pass filter, the attenuation slope is −20 dB/dec. In this case, the prefilter 112 may have frequency characteristics of attenuating the amplitude of the unnecessary signal so that Ak×(a/k)≦A0 is satisfied.

For example, since the amplitude of the unnecessary signal which appears at the frequency fd is A1, and the attenuation factor of the filter at the frequency fd is a, the frequency characteristics are adjusted so that A1×a≦A0 is satisfied.

The amplitude of the unnecessary signal which appears at the frequency 2fd is A2, and the attenuation factor of the filter at the frequency 2fd is a/k=a/2 since the prefilter 112 is a first-order filter. Therefore, the frequency characteristics are adjusted so that A2×(a/2)≦A0 is satisfied.

The amplitude of the unnecessary signal which appears at the frequency 3fd is A3, and the attenuation factor of the filter at the frequency 3fd is a/k=a/3 since the prefilter 112 is a first-order filter. Therefore, the frequency characteristics are adjusted so that A3×(a/3)≦A0 is satisfied.

If the above conditions are satisfied, the amplitude of the unnecessary signal which appears in the fd, 2fd, or 3fd frequency band can be attenuated to a value equal to or smaller than the amplitude of the desired signal when the prefilter 112 is a first-order low-pass filter.

A normal anti-aliasing prefilter is formed using a first-order low-pass filter. In FIG. 15, the prefilter 112 is operated as a second-order low-pass filter in order to remove the unnecessary signal with a large amplitude. Since the attenuation slope is −40 dB/dec when using a second-order low-pass filter, an unnecessary signal with a large amplitude can be easily removed. In FIG. 19, when the amplitudes A1 and A2 of the unnecessary signal at the frequencies fd and 2fd are about 100 to 500 times the amplitude A0 of the desired signal, an attenuation of about −40 dB to −60 dB is required at the frequencies fd and 2fd, for example. Such an attenuation can be easily obtained using a second-order low-pass filter.

In this embodiment, the filter section 110 shown in FIG. 15 is formed of a second-type operational amplifier OP2 described with reference to FIGS. 5B, 5C, and 11B. Specifically, the second-type operational amplifiers OP2 are used as the operational amplifiers OPH, OPG1, OPG2, and OPI of the filter section 110.

In FIG. 15, the SCF 114 with steep attenuation characteristics is used to remove the unnecessary signal due to the detuning frequency. The operational amplifiers OPG1 and OPG2 are necessary in order to realize the SCF 114.

In FIG. 15, the anti-aliasing prefilter 112 is also used as a filter which removes the unnecessary signal which appears at the frequency k×fd due to synchronous detection. Therefore, a second-order active low-pass filter is used as the prefilter 112, for example. The operational amplifier OPH is required for realizing the active low-pass filter.

In FIG. 15, the output circuit 116 functions as the output buffer which subjects the output signal VSQ to impedance conversion and also functions as the postfilter for the SCF 114. The operational amplifier OP1 is required for realizing the function of the output buffer and the function of the postfilter.

As described above, the operational amplifiers OPH, OPG1, OPG2, and OPI are provided in the filter section 110, and the SNR of the entire system deteriorates to a large extent when these operational amplifier have a high noise level.

In this embodiment, the second-type operational amplifiers OP2 with low flicker noise are used as the operational amplifiers OPH, OPG1, OPG2, and OPI. As a result, even if these operational amplifiers are used, flicker noise of the filter section 110 can be minimized, whereby the SNR of the entire system can be increased.

In the second-type operational amplifier OP2, the bias current Ib flowing through the differential section is smaller than the bias current Ia flowing through the differential section of the first-type operational amplifier OP1 (Ib<Ia). Therefore, an increase in power consumption of the entire system can be minimized, even if the operational amplifiers OPH, OPG1, OPG2, and OPI are provided in the filter section 110 as shown in FIG. 15.

5. Electronic Instrument

Figure 21:
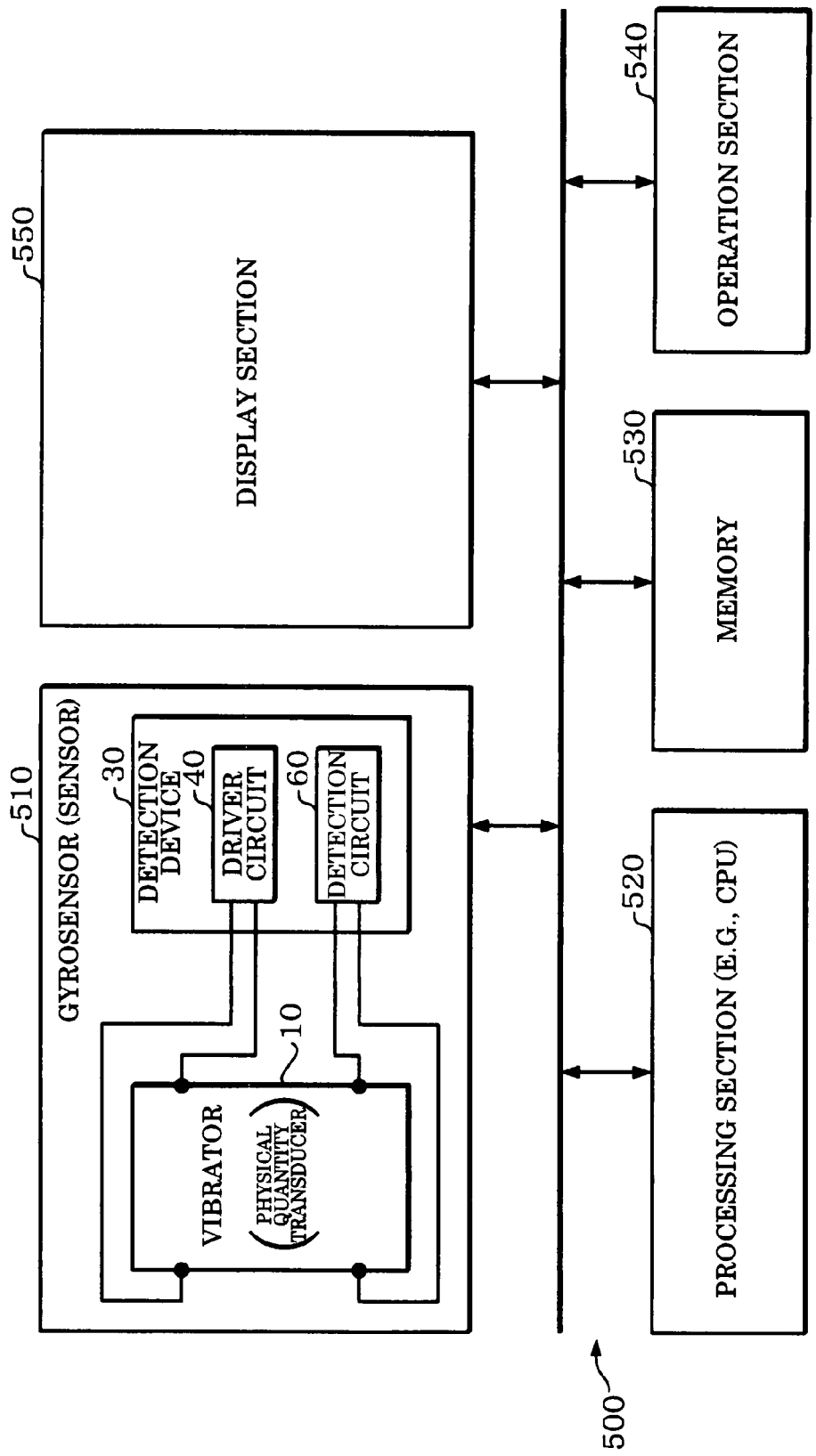
FIG. 21 shows a configuration example of an electronic instrument and a gyrosensor.

FIG. 21 shows a configuration example of a gyrosensor 510 (sensor in a broad sense) including the detection device 30 according to this embodiment, and an electronic instrument 500 including the gyrosensor 510. The electronic instrument 500 and the gyrosensor 510 are not limited to the configuration shown in FIG. 21. Various modification may be made such as omitting some elements or adding another element. As the electronic instrument 500 according to this embodiment, various electronic instruments such as a digital camera, a video camera, a portable telephone, a car navigation system, a robot, a game machine, and a personal digital assistant may be considered.

The electronic instrument 500 includes the gyrosensor 510 and a processing section 520. The electronic instrument 500 may also include a memory 530, an operation section 540, and a display section 550. The processing section (e.g., CPU or MPU) 520 controls the gyrosensor 510 and the like, and controls the entire electronic instrument 500. The processing section 520 performs processes based on information (angular velocity information or physical quantity) detected by the gyrosensor 510. For example, the processing section 520 performs processes for image blur correction, position control, GPS autonomous navigation, and the like based on the detected angular velocity information. The memory (e.g. ROM or RAM) 530 stores a control program and various types of data, and functions as a work area and a data storage area. The operation section 540 allows the user to operate the electronic instrument 500, and the display section 550 displays various types of information for the user. The detection device 30 according to this embodiment allows a small sensor to be employed as the gyrosensor 510 incorporated in the electronic instrument 500. This enables a reduction in size and cost of the electronic instrument 500.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. vibrator, gyrosensor, AGND, or SCF) cited with a different term (e.g. physical quantity transducer, sensor, analog reference voltage, or discrete-time filter) having a broader meaning or the same meaning at least once in the specification and the drawings can be replaced by the different term in any place in the specification and the drawings. The structure of the vibrator and the configurations of the detection device, the sensor, and the electronic instrument are not limited to those described in the above embodiments. Various modifications and variations may be made. The configurations and the operations of the amplifier circuit, the sensitivity adjustment circuit, the synchronous detection circuit, and the filter section are not limited to those described in the above embodiments. Various modifications and variations may be made.

What is claimed is:

1. A detection device comprising:
   a detection circuit that receives a detection signal from a physical quantity transducer driven using a driving signal, and detects a desired signal from the detection signal, the detection circuit including:
   an amplifier circuit that amplifies the detection signal from the physical quantity transducer;
   a synchronous detection circuit that synchronously detects signal amplified by the amplifier circuit; and
   a filter section provided in a subsequent stage of the synchronous detection circuit;
   the amplifier circuit including a first-type operational amplifier;
   the filter section including a second-type operational amplifier; and
   when a channel width and a channel length of a differential-stage transistor of a differential section of the first-type operational amplifier are respectively referred to as W1$a$ and L1$a$, a bias current flowing through the differential section of the first-type operational amplifier is referred to as Ia, a channel width and a channel length of a differential-stage transistor of a differential section of the second-type operational amplifier are respectively referred to as W1$b$ and L1$b$, and a bias current flowing through the differential section of the second-type operational amplifier is referred to as Ib, W1$b$×L1$b$>W1$a$×L1$a$ and Ia>Ib being satisfied.

2. The detection device as defined in claim 1,
   when a frequency of a carrier signal is referred to as f1, a frequency of the desired signal carried by the carrier signal is referred to as f2, and a corner frequency of flicker noise and thermal noise in frequency-noise characteristics is referred to as fcr, the first-type operational amplifier satisfying f1−fcr<fcr−f2, and the second-type operational amplifier satisfying fcr−f2<f1−fcr.

3. The detection device as defined in claim 1,
   the amplifier circuit including:
   first and second charge/voltage conversion circuits or first and second current/voltage conversion circuits that respectively amplify first and second detection signals from the physical quantity transducer; and
a differential amplifier circuit that differentially amplifies first and second output signals from the first and second charge/voltage conversion circuits or the first and second current/voltage conversion circuits; and
the first and second charge/voltage conversion circuits or the first and second current/voltage conversion circuits and the differential amplifier circuit including the first-type operational amplifier.

4. The detection device as defined in claim 1,
the detection circuit including a sensitivity adjustment circuit that is provided in a preceding stage of the synchronous detection circuit and adjusts sensitivity by variably controlling a gain; and
the sensitivity adjustment circuit including the first-type operational amplifier.

5. The detection device as defined in claim 4,
the sensitivity adjustment circuit operating as a programmable-gain amplifier and a high-pass filter.

6. The detection device as defined in claim 5,
the first-type operational amplifier being used in common by the high-pass filter as an active filter and the programmable-gain amplifier.

7. The detection device as defined in claim 1,
the filter section including:
a discrete-time filter; and
a continuous-time filter provided in a preceding stage of the discrete-time filter; and
the discrete-time filter including the second-type operational amplifier.

8. The detection device as defined in claim 7,
the physical quantity transducer being a vibrator that is caused to produce vibrations using a driving signal; and
the discrete-time filter having frequency characteristics for removing a component having a detuning frequency $\Delta f=|fd-fs|$ corresponding to a difference between a driving-side resonance frequency fd and a detection-side resonance frequency fs of the vibrator and allowing a frequency component of the desired signal to pass through.

9. The detection device as defined in claim 8,
the continuous-time filter including the second-type operational amplifier; and
the continuous-time filter having frequency characteristics for attenuating amplitude of an unnecessary signal which appears in a frequency band of a frequency k×fd (k is a positive integer) due to synchronous detection by the synchronous detection circuit to a value equal to or smaller than amplitude of the desired signal.

10. The detection device as defined in claim 1,
the synchronous detection circuit including a third-type operational amplifier; and
when a channel width and a channel length of a differential-stage transistor of a differential section of the third-type operational amplifier are respectively referred to as $W1c$ and $L1c$ and a bias current which flows through the differential section of the third-type operational amplifier is referred to as Ic, $W1c \times L1c > W1a \times L1a$ and $Ic > Ib$ being satisfied.

11. The analog circuit as defined in claim 1, further comprising:
a reference voltage supply circuit that supplies an analog reference voltage to the detection circuit;
the reference voltage supply circuit including:

a first supply circuit that includes a reference-voltage first-type operational amplifier and supplies the analog reference voltage to the amplifier circuit; and
a second supply circuit that includes a reference-voltage second-type operational amplifier and supplies the analog reference voltage to the filter section; and
when a channel width and a channel length of a differential-stage transistor of a differential section of the reference-voltage first-type operational amplifier are respectively referred to as $W1d$ and $L1d$, a bias current flowing through the differential section of the reference-voltage first-type operational amplifier is referred to as Id, a channel width and a channel length of a differential-stage transistor of a differential section of the reference-voltage second-type operational amplifier are respectively referred to as $W1e$ and $L1e$, and a bias current flowing through the differential section of the reference-voltage second-type operational amplifier is referred to as Ie, $W1e \times L1e > W1d \times L1d$ and $Id > Ie$ being satisfied.

12. A detection device comprising:
a detection circuit that receives a detection signal from a physical quantity transducer driven using a driving signal, and detects a desired signal from the detection signal, the detection circuit including:
an amplifier circuit that amplifies the detection signal from the physical quantity transducer;
a synchronous detection circuit that synchronously detects the-stela signal amplified by the amplifier circuit; and
a filter section provided in a subsequent stage of the synchronous detection circuit;
the amplifier circuit including a first-type operational amplifier;
the filter section including a second-type operational amplifier;
the first-type operational amplifier being an operational amplifier of which thermal noise at a frequency of a carrier signal is lower than that of the second-type operational amplifier; and
the second-type operational amplifier being an operational amplifier of which flicker noise at a frequency of the desired signal is lower than that of the first-type operational amplifier.

13. The detection device as defined in claim 12,
when a frequency of a carrier signal is referred to as f1, a frequency of the desired signal carried by the carrier signal is referred to as f2, and a corner frequency of flicker noise and thermal noise in frequency-noise characteristics is referred to as fcr, the first-type operational amplifier satisfying f1−fcr<fcr−f2, and the second-type operational amplifier satisfying fcr−f2<f1−fcr.

14. The detection device as defined in claim 12,
the synchronous detection circuit including a third-type operational amplifier; and
the third-type operational amplifier being an operational amplifier of which thermal noise at the frequency of the carrier signal is lower than that of the second-type operational amplifier and flicker noise at the frequency of the desired signal is lower than that of the first-type operational amplifier.

15. The detection device as defined in claim 1,
the physical quantity transducer being a vibrator that is caused to produce vibrations using a driving signal.

16. The detection device as defined in claim 12,
the physical quantity transducer being a vibrator that is caused to produce vibrations using a driving signal.

17. A sensor comprising:
the detection device as defined in claim 1; and the physical quantity transducer.

18. A sensor comprising:

the detection device as defined in claim 12; and the physical quantity transducer.

19. An electronic instrument comprising:

the sensor as defined in claim 17; and a processing section that performs processes based on detection information of the sensor.

20. An electronic instrument comprising:

the sensor as defined in claim 18; and a processing section that performs processes based on detection information of the sensor.

* * * * *